(12) United States Patent
Terada

(10) Patent No.: US 7,821,759 B2
(45) Date of Patent: *Oct. 26, 2010

(54) SURGE ABSORPTION CIRCUIT

(75) Inventor: Yuji Terada, Tokyo (JP)

(73) Assignee: TDK Corporation, Tokyo (JP)

( * ) Notice: Subject to any disclaimer, the term of this patent is extended or adjusted under 35 U.S.C. 154(b) by 273 days.

This patent is subject to a terminal disclaimer.

(21) Appl. No.: 12/078,561

(22) Filed: Apr. 1, 2008

(65) Prior Publication Data

US 2008/0192401 A1 Aug. 14, 2008

Related U.S. Application Data

(63) Continuation of application No. 11/288,131, filed on Nov. 29, 2005, now Pat. No. 7,397,646.

(30) Foreign Application Priority Data

Nov. 30, 2004 (JP) ............................. 2004-347739
Jun. 30, 2005 (JP) ............................. 2005-193025

(51) Int. Cl.
*H01C 7/12* (2006.01)
(52) U.S. Cl. ...................... 361/127; 361/118
(58) Field of Classification Search ......... 361/117–120, 361/127
See application file for complete search history.

(56) References Cited

U.S. PATENT DOCUMENTS

| | | |
|---|---|---|
| 3,340,458 A | 9/1967 | Keller |
| 3,972,020 A | 7/1976 | Carroll et al. |
| 4,554,608 A | 11/1985 | Block |
| 4,870,534 A | 9/1989 | Harford |
| 5,124,873 A | 6/1992 | Wheeler et al. |
| 5,668,511 A | 9/1997 | Furutani et al. |
| 5,949,299 A | 9/1999 | Harada |
| 5,966,283 A | 10/1999 | Glaser et al. |

(Continued)

FOREIGN PATENT DOCUMENTS

EP 1 303 004 A 4/2003

(Continued)

OTHER PUBLICATIONS

Notice of Reasons for Rejection issued in Japanese Patent Application No. 2005-221665; Jan. 5, 2010.

(Continued)

*Primary Examiner*—Danny Nguyen
(74) *Attorney, Agent, or Firm*—Oliff & Berridge, PLC

(57) ABSTRACT

A surge absorption circuit according to an embodiment comprises (a) an input terminal, (b) an output terminal, (c) a common terminal, (d) a mutual inductive element having a first inductive element and a second inductive element which are electromagnetically coupled to each other so as to increase each inductance, wherein one terminal of the first inductive element is connected to the input terminal, one terminal of the second inductive element is connected to the output terminal, and the other terminal of the first inductive element and the other terminal of the second inductive element are connected to each other, and (e) a surge absorption element having one terminal connected to the other terminal of the first inductive element and the other terminal of the second inductive element and the other terminal connected to the common terminal.

12 Claims, 29 Drawing Sheets

U.S. PATENT DOCUMENTS

| | | | |
|---|---|---|---|
| 6,137,352 A | 10/2000 | Germann | |
| 6,236,551 B1 | 5/2001 | Jones et al. | |
| 6,384,705 B1 | 5/2002 | Huang et al. | |
| 6,785,110 B2 | 8/2004 | Bartel et al. | |
| 6,937,115 B2 | 8/2005 | Perrault et al. | |
| 7,085,118 B2 | 8/2006 | Inoue et al. | |
| 7,221,550 B2 | 5/2007 | Chang et al. | |
| 7,397,646 B2 * | 7/2008 | Terada | 361/127 |
| 7,551,417 B2 | 6/2009 | Miyata | |
| 2004/0145849 A1 | 7/2004 | Chang et al. | |
| 2004/0264087 A1 | 12/2004 | Bishop | |
| 2006/0038635 A1 | 2/2006 | Richiuso et al. | |

FOREIGN PATENT DOCUMENTS

| | | |
|---|---|---|
| GB | 2 302 621 A | 1/1997 |
| JP | A-52-028839 | 3/1977 |
| JP | A-55-60318 | 5/1980 |
| JP | U-58-100434 | 7/1983 |
| JP | U-58-173924 | 11/1983 |
| JP | U 61-64728 | 5/1986 |
| JP | A-61-125103 | 6/1986 |
| JP | A-61-189601 | 8/1986 |
| JP | U-62-2202 | 1/1987 |
| JP | B2 62-18874 | 4/1987 |
| JP | A-62-108509 | 5/1987 |
| JP | A-63-39207 | 2/1988 |
| JP | U 1-93823 | 6/1989 |
| JP | U-3-20408 | 2/1991 |
| JP | A-3-140006 | 6/1991 |
| JP | A 3-151605 | 6/1991 |
| JP | A 03 274815 | 12/1991 |
| JP | A 04-129312 | 4/1992 |
| JP | A-4-167508 | 6/1992 |
| JP | A-4-257112 | 9/1992 |
| JP | A-05-083852 | 4/1993 |
| JP | A-06-140208 | 5/1994 |
| JP | A 08-250309 | 9/1996 |
| JP | A-10-42450 | 2/1998 |
| JP | A 10-200360 | 7/1998 |
| JP | A 10-304561 | 11/1998 |
| JP | A 10-335115 | 12/1998 |
| JP | A 11-243006 | 9/1999 |
| JP | A 2000-228255 | 8/2000 |
| JP | A 2001-60838 | 3/2001 |
| JP | A-2001-160125 | 6/2001 |
| JP | A-2001-160728 | 6/2001 |
| JP | A-2002-077454 | 3/2002 |
| JP | A 2002-170740 | 6/2002 |
| JP | A-2003-168944 | 6/2003 |
| JP | A 2004-311877 | 11/2004 |
| JP | A-2005-505188 | 2/2005 |
| JP | A-2005-064779 | 3/2005 |
| JP | A 2005-136736 | 5/2005 |
| JP | A 2005-311125 | 11/2005 |
| JP | A 2005-333427 | 12/2005 |
| WO | WO 03/030386 A1 | 4/2003 |
| WO | WO 03/103091 | 12/2003 |

OTHER PUBLICATIONS

Notice of Reasons for Rejection issued in Japanese Patent Application No. 2006-053226; Jan. 5, 2010.

Kazu Watanabe, "Modern Electrotechnology Course, The theory and design of transmission circuit," Ohmsha Ltd., First Edition, First Copy, Dec. 26, 1968, pp. 338-339.

Oct. 21, 2009 Office Action issued in Japanese patent application No. P2005-193025 (with translation).

* cited by examiner

SURGE ABSORPTION CIRCUIT

This is a Continuation of application Ser. No. 11/288,131, filed Nov. 29, 2005. The entire disclosures of the prior application is hereby incorporated by reference herein in their entireties.

BACKGROUND OF THE INVENTION

1. Field of the Invention

The present invention relates to a surge absorption circuit with improved high frequency characteristics.

2. Related Background of the Invention

Semiconductor devices such as IC and LSI are destroyed or degraded in characteristics by high voltage static electricity. As a countermeasure against the static electricity for the semiconductor device, a surge absorption element such as a varistor is used. The surge absorption element typically represented by a varistor has a stray capacitive component and a stray inductive component, therefore, if applied to a circuit dealing with a high speed signal, it degrades the signal.

FIG. 1 is a diagram showing a conventional surge absorption circuit to which a varistor is applied. A surge absorption circuit 200 shown in FIG. 1 has an input/output terminal 201, a common terminal 202 and a varistor 203. When an input signal with a small amplitude is input to the input/output terminal 201, the varistor 203 remains highly resistive and does not give influence on the input signal. On the other hand, when a high voltage surge enters the input/output terminal 201, the high voltage surge is forced to pass through the varistor 203 to the common terminal 202. As a result, if the surge absorption circuit 200 shown in FIG. 1 is connected to the input/output terminal of a semiconductor device, the semiconductor device is protected from a high voltage surge.

FIG. 2 is a diagram showing an equivalent circuit of a varistor. As shown in FIG. 2, a varistor can be expressed equivalently by a variable resistor 204 and a stray capacitance 205, provided in parallel between one terminal and the other terminal. The resistance value of the variable resistor 204 is large in general, and becomes small when a high voltage surge is applied, therefore, it is possible for a varistor to protect a semiconductor device from a high voltage surge. However, since there exists the stray capacitance 205, a varistor attached to the input/output side of a semiconductor device dealing with a high speed signal may be a cause of degradation of the high speed signal.

FIG. 3 is a diagram showing the calculation result of S parameters S11 and S21 of the surge absorption circuit expressed by the equivalent circuit shown in FIG. 2. FIG. 3 shows the S parameters S11 and S21 when the capacitance Cz of the stray capacitance is 1 pF, 3 pF, and 5 pF, respectively. When the stray capacitance is 5 pF, S21 begins to degrade when the frequency of a signal exceeds 100 MHz and it is no longer possible to transmit the signal. In addition, S11 also becomes large and the reflection characteristic degrades. Even when the stray capacitance is 1 pF, the same result occurs when the frequency of the signal exceeds 1 GHz. Since the stray capacitance has a tradeoff relationship to a clamping voltage and an energy durability, there has been a problem that a surge absorption element having excellent characteristic cannot be applied to the use of a high speed signal.

FIG. 4 is a diagram showing the TDR (Time Domain Reflectometry) test result of a conventional surge absorption circuit. FIG. 4 shows TDR when the capacitance Cz of the stray capacitance is 1 pF, 3 pF, and 5 pF, respectively. An input impedance Zi for a pulse signal whose rise time and fall time are 200 ps and signal amplitude is 1 $V_{0-p}$ degrades to about 40 Ω when the stray capacitance is 5 pF while it is 100 Ω in the steady state. Even when the stray capacitance is 1 pF, the input impedance degrades to 80Ω.

As described above, when a surge absorption circuit is applied to a circuit dealing with a high speed signal, it is necessary to reduce the stray capacitive component to avoid degradation in the rise characteristic and delay characteristic of a high speed signal. On the other hand, if the stray capacitive component of a surge absorption element is reduced, the clamping voltage of the surge absorption element is raised and the energy durability is reduced.

A surge absorption circuit that reduces the influence of the stray capacitive component has already been proposed. For example, by combining an inductive element and a surge absorption element, it is possible to attain impedance matching of the surge absorption circuit. FIG. 5 is a diagram showing an example of a conventional surge absorption circuit that combines two inductive elements with a varistor. In a surge absorption circuit 210 shown in FIG. 5, a series circuit in which two inductive elements 214 and 215 are connected in series is provided between an input terminal 211 and an output terminal 212 and a varistor 216 is connected between the middle point of the series circuit and a common terminal 213.

FIG. 6 is a diagram showing an example of a conventional surge absorption circuit in which an inductive element is combined with two varistors. In a surge absorption circuit 220 shown in FIG. 6, a parallel circuit having a varistor 224 and an inductive element 225 is connected to a varistor 223 in series between an input/output terminal 221 and a common terminal 222. Such a surge absorption circuit is disclosed in, for example, Japanese Patent Application Laid-open No. 2001-60838.

SUMMARY OF THE INVENTION

However, even the circuit shown in FIG. 5 cannot realize sufficient characteristics. An input impedance Zin of the circuit shown in FIG. 5 is expressed by the following equation (1). The varistor 216 is expressed by the equivalent circuit shown in FIG. 2, however, it is approximated only by the stray capacitance 205 in FIG. 2 for a high speed signal with small amplitude.

$$Zin = \sqrt{\frac{2Lz}{Cz} - \omega^2 Lz^2} \quad (1)$$

The input impedance Zin in the equation (1) becomes a value shown in the following equation (3) when the following expression (2-1) and the following expression (2-2) are satisfied. $Z_0$ is a characteristic impedance of a signal line into which a surge absorption circuit is inserted.

$$\frac{2Lz}{Cz} \gg \omega^2 Lz^2 \quad (2\text{-}1)$$

$$Z_0 \gg \omega Lz \quad (2\text{-}2)$$

$$Zin = \sqrt{\frac{2Lz}{Cz}} \quad (3)$$

Therefore, if an inductive element of which inductance Lz is equal to be a value shown in the following equation (4) is used, it is possible to match the input impedance to the characteristic impedance of the signal line.

$$Lz = \frac{Z_0^2 Cz}{2} \quad (4)$$

However, because of the conditions of the expression (2-1) and expression (2-2), it is not possible to match the input impedance to the characteristic impedance at high frequencies. Therefore, even if an inductive element having the inductance shown in the equation (4) is applied to the circuit shown in FIG. 5, the situation remains unchanged and it is still necessary to reduce the stray capacitance of the varistor.

Frequency characteristics of a surge absorption circuit, which is a passive circuit, are sufficient to evaluate its input impedance. Hereinafter, the frequency characteristics of a surge absorption circuit are evaluated by an input impedance.

Even in a circuit shown in FIG. 6, it is difficult to realize impedance matching over a wide frequency band because the stray capacitance of the varistor 223 and the inductive element 225 constitute a band pass filter as a result. Therefore, it is not possible to realize sufficient characteristics for a high speed signal.

Therefore, an object of the present invention is to provide a surge absorption circuit excellent in impedance even for a high speed signal.

A first surge absorption circuit of the present invention cancels the influence of the stray capacitive component of a surge absorption element by utilizing a mutual inductive element.

Specifically, the first surge absorption circuit of the present invention is a surge absorption circuit comprising an input terminal, an output terminal, and a common terminal for connection with the external, and further comprising (a) a mutual inductive element in which one terminal of a primary side is connected to the input terminal, one terminal of a secondary side in which the inverted induction of a signal occurs is connected to the output terminal, and the other terminal of the primary side and the other terminal of the secondary side are connected to each other, and (b) a surge absorption element in which one terminal is connected to the connection point of the other terminal of the primary side and the other terminal of the secondary side of the mutual inductive element, and the other terminal is connected to the common terminal.

In other words, the first surge absorption circuit of the present invention comprises the input terminal, the output terminal, the common terminal, the mutual inductive element, and the surge absorption element. The mutual inductive element has a first inductive element (the primary side) and a second inductive element (the secondary side). The first inductive element and the second inductive element are electromagnetically coupled to each other so as to increase each inductance. One terminal of the first inductive element is connected to the input terminal, one terminal of the second inductive element is connected to the output terminal, and the other terminal of the first inductive element and the other terminal of the second inductive element are connected to each other. The surge absorption element has one terminal connected to the other terminal of the first inductive element and the other terminal of the second inductive element and the other terminal connected to the common terminal. If the coupling coefficient between the first inductive element and the second inductive element is 0.01 or more, the first inductive element and the second inductive element are electromagnetically coupled so as to increase each inductance.

In the first surge absorption circuit, the primary side and the secondary side of the mutual inductive element are connected so that the inverted induction occurs. "Inverted induction" means that a signal input to one of the primary side and the secondary side is output to the other of the primary side and the secondary side in the opposite direction. In other words, the first inductive element and the second inductive element are electromagnetically coupled so as to increase each inductance. Therefore, in the first surge absorption circuit, it is possible to set a value of a mutual inductive element appropriately to the stray capacitive component of a surge absorption element. Due to this, it is possible to realize an input impedance with flat frequency characteristics over a wide frequency band by canceling the influence of the stray capacitive component. Further, it is made possible to attain impedance matching even for a high speed signal.

In other words, the first surge absorption circuit is capable of protecting a semiconductor device and the like from high voltage static electricity and is excellent in impedance matching even for a high speed signal.

A second surge absorption circuit of the present invention cancels the influence of the stray capacitive component and the stray inductive component of the surge absorption element by further comprising a capacitive element, in addition to the configuration of the first surge absorption circuit.

Specifically, in the second surge absorption circuit, the capacitive element is provided in parallel to a mutual inductive element and connected to an input terminal and an output terminal.

According to the second surge absorption circuit, since the capacitive element is added, it is possible to set values of the mutual inductive element and the capacitive element flexibly with respect to the stray capacitive component of the surge absorption element and realize an input impedance with flat frequency characteristics over a wide frequency band by canceling the influence of the stray capacitive component.

Further, in the second surge absorption circuit, since the primary side and the secondary side of the mutual inductive element are connected so that the inverted induction occurs, it is possible to obtain a negative inductance component. By canceling the influence of the stray inductive component with the negative inductance component and compensating the amount of decrease in inductance of the inductive element with the capacitive element connected between the input terminal and the output terminal, it is possible to realize an input impedance with flat frequency characteristics over a wide frequency band by canceling the influence of the stray capacitive component and the stray inductive component.

Therefore, the second surge absorption circuit is capable of protecting a semiconductor device and the like from high voltage static electricity and is excellent in impedance matching even for a high speed signal.

A third surge absorption circuit of the present invention cancels the influence of the stray capacitive component of a surge absorption element by utilizing two inductive elements and a capacitive element.

Specifically, the third surge absorption circuit is a surge absorption circuit comprising an input terminal, and an output terminal, and a common terminal for connection to the external, further comprising (a) two inductive elements connected in series between the input terminal and the output terminal, (b) a capacitive element connected between the input terminal and the output terminal, and (c) a surge absorption element connected between the connection point of the two inductive elements connected in series and the common terminal.

In other words, the third surge absorption circuit comprises the input terminal, the output terminal, the common terminal, the two inductive elements, the capacitive element, and the surge absorption element. The two inductive elements are connected in series and provided between the input terminal and the output terminal. The capacitive element is connected to the input terminal and the output terminal and provided in parallel to the two inductive elements. The surge absorption element is connected to the connection point of the two inductive elements and the common terminal. The two inductive elements may not be coupled electromagnetically. In other words, the coupling coefficient of the two inductive elements may be less than 0.01.

Since in the third surge absorption circuit it is possible to set values of the inductive element and the capacitive element appropriately to the stray capacitive component of the surge absorption element, it is possible to realize an input impedance with flat frequency characteristics over a wide frequency band by canceling the influence of the stray capacitive component.

Therefore, the third surge absorption circuit is capable of protecting a semiconductor device and the like from high voltage static electricity and is excellent in impedance matching even for a high speed signal.

A fourth surge absorption circuit of the present invention cancels the influence of the stray capacitive component of a surge absorption element by utilizing a mutual inductive element.

Specifically, the fourth surge absorption circuit is a surge absorption circuit comprising a common terminal, a pair of input terminals, and a pair of output terminals, further comprising (a) a first mutual inductive element in which one terminal of a primary side is connected to one of the pair of input terminals, one terminal of a secondary side in which the inverted induction of a signal occurs is connected to one of the pair of output terminals, and the other terminal of the primary side and the other terminal of the secondary side are connected mutually, (b) a first surge absorption element in which one terminal is connected to the connection point of the other terminal of the primary side and the other terminal of the secondary side of the first mutual inductive element and the other terminal is connected to the common terminal, (c) a second mutual inductive element in which one terminal of a primary side is connected to the other of the pair of input terminals and one terminal of a secondary side in which the inverted induction of a signal occurs is connected to the other of the pair of output terminals and the other terminal of the primary side and the other terminal of the secondary side are connected mutually, and (d) a second surge absorption element in which one terminal is connected to the connection point of the other terminal of the primary side and the other terminal of the secondary side of the second mutual inductive element and the other terminal is connected to the common terminal.

In other words, the fourth surge absorption circuit comprises the common terminal, the pair of input terminals, the pair of output terminals, the first mutual inductive element, the first surge absorption element, the second mutual inductive element, and the second surge absorption element. The first mutual inductive element has a first inductive element (the primary side of the first mutual inductive element) and a second inductive element (the secondary side of the first mutual inductive element) which are electromagnetically coupled to each other so as to increase each inductance. One terminal of the first inductive element is connected to one of the pair of input terminals, one terminal of the second inductive element is connected to one of the pair of output terminals, and the other terminal of the first inductive element and the other terminal of the second inductive element is connected to each other. The first surge absorption element has one terminal connected to the other terminal of the first inductive element and the other terminal of the second inductive element, and the other terminal connected to the common terminal. The second mutual inductive element has a third inductive element (the primary side of the second mutual inductive element) and a fourth inductive element (the secondary side of the second mutual inductive element) which are electromagnetically coupled to each other so as to increase each inductance. One terminal of the third inductive element is connected to the other of the pair of input terminals, one terminal of the fourth inductive element is connected to the other of the pair of output terminals, and the other terminal of the third inductive element and the other terminal of the fourth inductive element are connected to each other. The second surge absorption element has one terminal connected to the other terminal of the third inductive element and the other terminal of the fourth inductive element, and the other terminal connected to the common terminal.

In the fourth surge absorption circuit, between one of the pair of input terminals and one of the pair of output terminals and between the other of the pair of input terminals and the other of the pair of output terminals, the primary side and the secondary side of the mutual inductive element are connected such that the inverted induction occurs, respectively. In other words, in the fourth surge absorption circuit, the first inductive element and the second inductive element are electromagnetically coupled so as to increase each inductance. Further, the third inductive element and the fourth inductive element are electromagnetically coupled so as to increase each inductance. Therefore, it is possible to set the value of the first mutual inductive element and the value of the second mutual inductive element appropriately to the stray capacitive component of the first surge absorption element and the stray capacitive component of the second surge absorption element. Due to this, it is possible to realize an input impedance with flat frequency characteristics over a wide frequency band by canceling the influence of the stray capacitive component. Further, it is made possible to attain impedance matching even for a high speed signal.

In other words, the fourth surge absorption circuit is capable of protecting a semiconductor device and the like from high voltage static electricity and is excellent in impedance matching even for a high speed signal of differential inputs.

A fifth surge absorption circuit of the present invention is a circuit that cancels the influence of the stray capacitive component and the stray inductive component of a surge absorption element by further adding a capacitive elements between the input terminals and the output terminals of the fourth surge absorption circuit.

Specifically, the fifth surge absorption circuit further comprises, in addition to the configuration of the fourth surge absorption circuit, a first capacitive element and a second capacitive element. The first capacitive element is provided in parallel to the first mutual inductive element and connected to the one of the pair of input terminals and the one of the pair of output terminals. The second capacitive element is provided in parallel to the second mutual inductive element and connected to the other of the pair of input terminals and the other of the pair of output terminals.

According to the fifth surge absorption circuit, since the first and second capacitive elements are added, it is possible to set the values of the first and second mutual inductive elements and the first and second capacitive elements flexibly with respect to the stray capacitive components of the first and second surge absorption elements, and to realize an input impedance with flat frequency characteristics over a wide frequency band by canceling the influence of the stray capacitive component.

Further, in the fifth surge absorption circuit, the primary side and the secondary side of each of the first mutual inductive element and the second mutual inductive element are connected, in such a way that the inverted induction occurs, therefore, it is possible to obtain a negative inductance component. By canceling the influence of the stray inductive component with the negative inductance component and compensating the amount of decrease in inductance of the inductive element with the capacitive element connected between the input terminal and the output terminal, it is possible to realize an input impedance with flat frequency characteristics over a wide frequency band by canceling the influence of the stray capacitive component and the stray inductive component.

Therefore, the fifth surge absorption circuit is capable of protecting a semiconductor device and the like from high voltage static electricity and is excellent in impedance matching even for a high speed signal of differential inputs.

A sixth surge absorption circuit of the present invention cancels the influence of the stray capacitive component of a surge absorption element by utilizing four inductive elements and two capacitive elements.

Specifically, the sixth surge absorption circuit is a surge absorption circuit comprising a common terminal, a pair of input terminals, and a pair of output terminals, further comprising (a) a first inductive element and a second inductive element connected in series between one of the pair of input terminals and one of the pair of output terminals, (b) a first capacitive element connected between one of the pair of input terminals and one of the pair of output terminals, (c) a first surge absorption element connected between the connection point of the first inductive element and the second inductive element connected in series and the common terminal, (d) a third inductive element and a fourth inductive element connected in series between the other of the pair of input terminals and the other of the pair of output terminals, (e) a second capacitive element connected between the other of the pair of input terminals and the other of the pair of output terminals, and (f) a second surge absorption element connected between the connection point of the third inductive element and the fourth inductive element connected in series and the common terminal.

In other words, the sixth surge absorption circuit comprises the common terminal, the pair of input terminals, the pair of output terminals, the first inductive element, the second inductive element, the first capacitive element, the first surge absorption element, the third inductive element, the fourth inductive element, the second capacitive element, and the second surge absorption element. The first inductive element and the second inductive element are connected in series and provided between one of the pair of input terminals and one of the pair of output terminals. The first capacitive element is connected to the one of the pair of input terminals and the one of the pair of output terminals and provided in parallel to the first inductive element and the second inductive element. The first surge absorption element is connected to the connection point of the first inductive element and the second inductive element and the common terminal. The third inductive element and the fourth inductive element are connected in series and provided between the other of the pair of input terminals and the other of the pair of output terminals. The second capacitive element is connected to the other of the pair of input terminals and the other of the pair of output terminals and provided in parallel to the third inductive element and the fourth inductive element. The second surge absorption element is connected to the connection point of the third inductive element and the fourth inductive element and the common terminal. The first to fourth inductive elements may not be coupled electromagnetically to each other. In other words, each coupling coefficient of each of the first to fourth inductive elements may be less than 0.01.

Since in the sixth surge absorption circuit it is possible to set values of the inductive element and the capacitive element appropriately to the stray capacitive component of the surge absorption element, it is possible to realize an input impedance with flat high frequency characteristics over a wide frequency band by canceling the influence of the stray capacitive component.

Therefore, the sixth surge absorption circuit is capable of protecting a semiconductor device and the like from high voltage static electricity and is excellent in impedance matching even for a high speed signal of differential inputs.

DESCRIPTION OF THE PREFERRED EMBODIMENTS

Embodiments of the present invention are explained below with reference to accompanying drawings. The following embodiments to be explained below are only configuration examples of the present invention and the present invention is not limited to the following embodiments.

In the following embodiments, as a representative example of the surge absorption element, a varistor is employed. However, as a matter of course, even if the varistor is replaced with another surge absorption element, the same operation and effect can be expected.

First Embodiment

Figure 7:
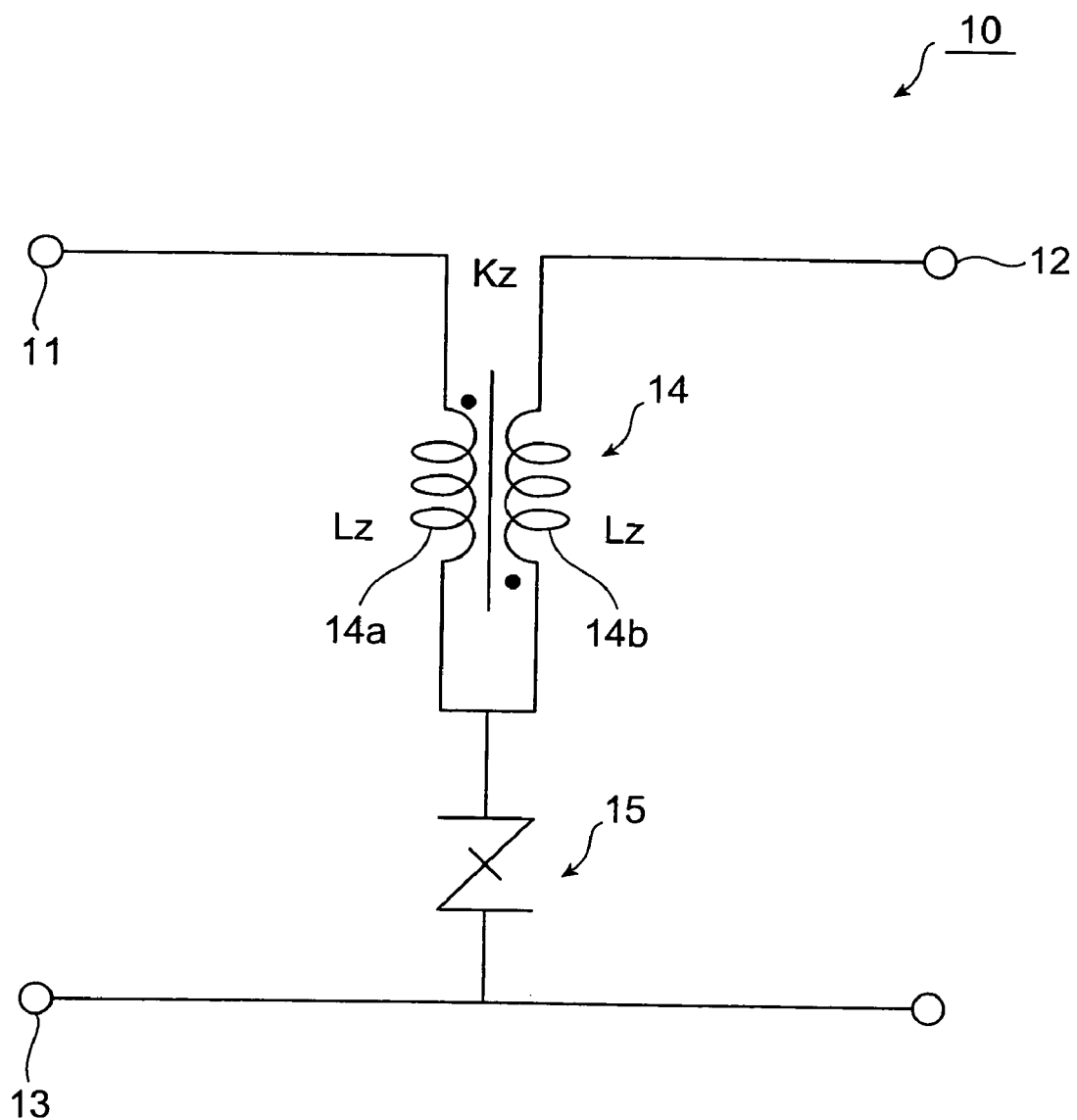
FIG. 7 is a diagram showing a circuit configuration of a surge absorption circuit according to a first embodiment of the present invention.

FIG. 7 is a diagram showing a circuit configuration of a surge absorption circuit according to a first embodiment of the present invention. A surge absorption circuit 10 shown in FIG. 7 comprises an input terminal 11, an output terminal 12, a common terminal 13, a mutual inductive element 14, and a surge absorption element 15. The input terminal 11, the output terminal 12, and the common terminal 13 are provided for connection with the external.

In the mutual inductive element 14, one terminal of the primary side is connected to the input terminal 11, one terminal of the secondary side in which the inverted induction of a signal occurs is connected to the output terminal 12, and the other terminal of the primary side and the other terminal of the secondary side are connected to each other. In other words, the mutual inductive element 14 has a first inductive element (the primary side) 14a and a second inductive element (the secondary side) 14b which are electromagnetically coupled to each other so as to increase an inductance each other. The mutual inductive element 14 can be realized by, for example, a common mode choke coil or a transformer.

In the following explanation, it is assumed that the inductance of each of the first inductive element 14a and the second inductive element 14b of the mutual inductive element 14 is Lz and the coupling coefficient of the first inductive element 14a and the second inductive element 14b is Kz. The first inductive element 14a and the second inductive element 14b are electromagnetically coupled to each other so as to increase an inductance each other, and the coupling coefficient Kz is equal to or more than 0.01.

One terminal of the surge absorption element 15 is connected to the connection point of the other terminal of the primary side and the other terminal of the secondary side of the mutual inductive element 14 and the other terminal of the surge absorption element 15 is connected to the common terminal 13.

To the surge absorption element 15, a varistor utilizing a metal oxide such as ZnO, a PN junction element utilizing a semiconductor such as Si, a surge absorption element utilizing molybdenum, a gap type discharge element utilizing discharge between electrodes, and the like can be applied.

Here, the input terminal 11 and the output terminal 12 are distinguished from each other, however, the input side and the output side may be exchanged. Preferably, the common terminal 13 is grounded.

Figure 8:
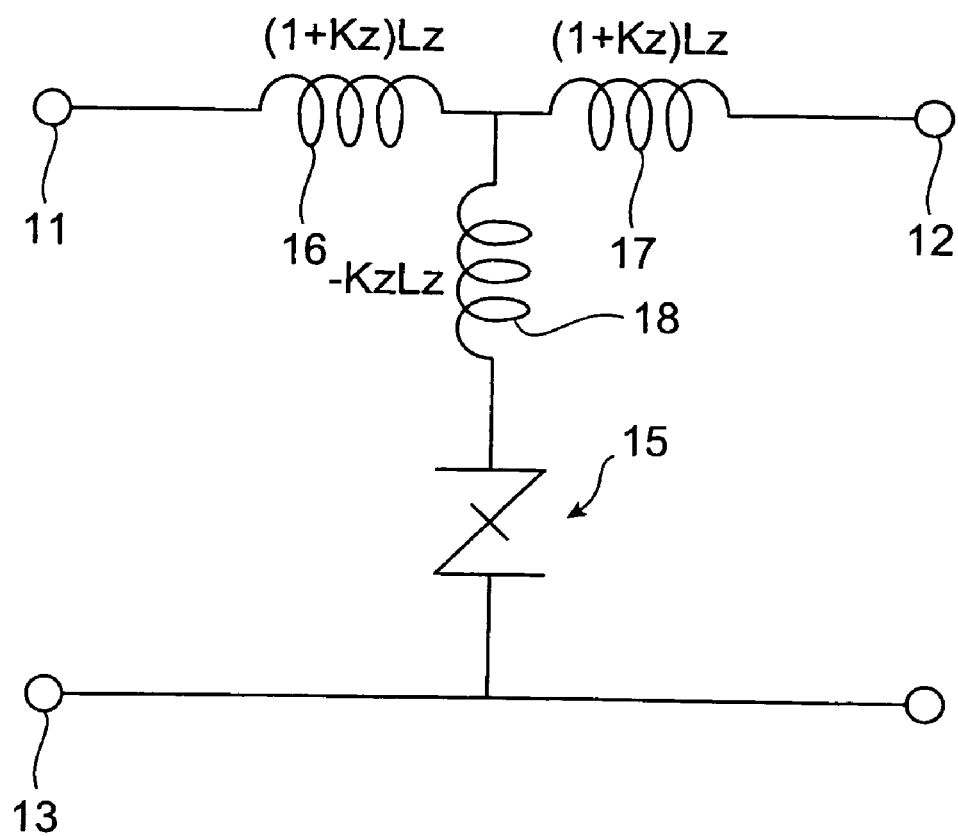
FIG. 8 is a diagram showing an equivalent circuit of the surge absorption circuit shown in FIG. 7.

FIG. 8 is a diagram showing an equivalent circuit of the surge absorption circuit shown in FIG. 7. The circuit configuration in FIG. 7 can be equivalently converted into the circuit configuration in FIG. 8.

In FIG. 8, the same symbol as that in FIG. 7 represents the same meaning.

In the equivalent circuit shown in FIG. 8, an inductive element 16 and an inductive element 17 are connected in series between the input terminal 11 and the output terminal 12. Further, an inductive element 18 and the surge absorption element 15 are connected in series between the middle point of the inductive element 16 and the inductive element 17 connected in series and the common terminal 13. The coefficient of induction of each of the inductive elements 16 and 17 is (1+Kz) Lz and the coefficient of induction of the inductive element 18 is −KzLz.

Figure 1:
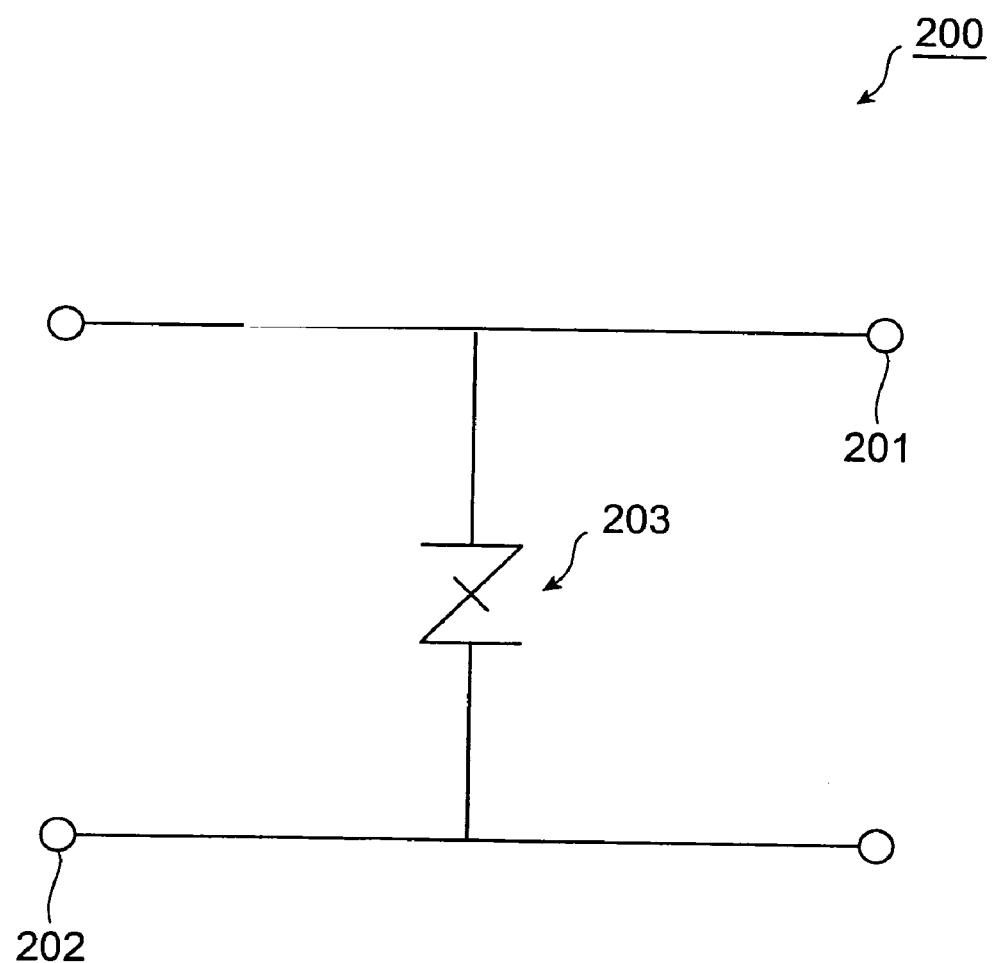
FIG. 1 is a diagram showing a conventional surge absorption circuit to which a varistor has been applied.
Figure 2:
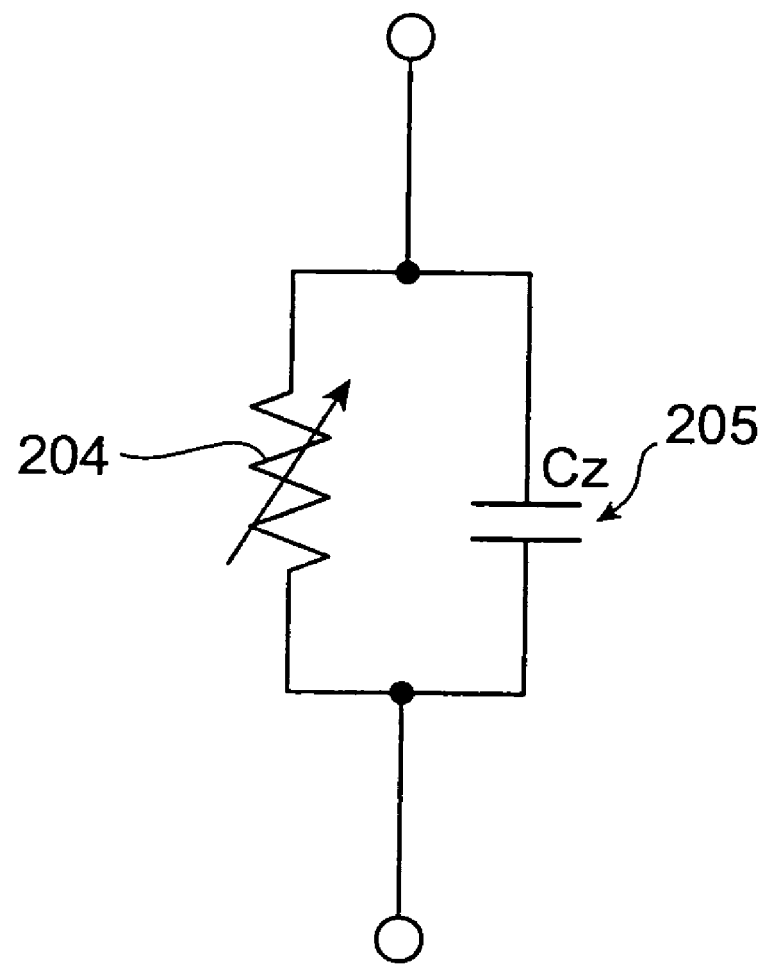
FIG. 2 is a diagram showing an equivalent circuit of a varistor.
Figure 3:
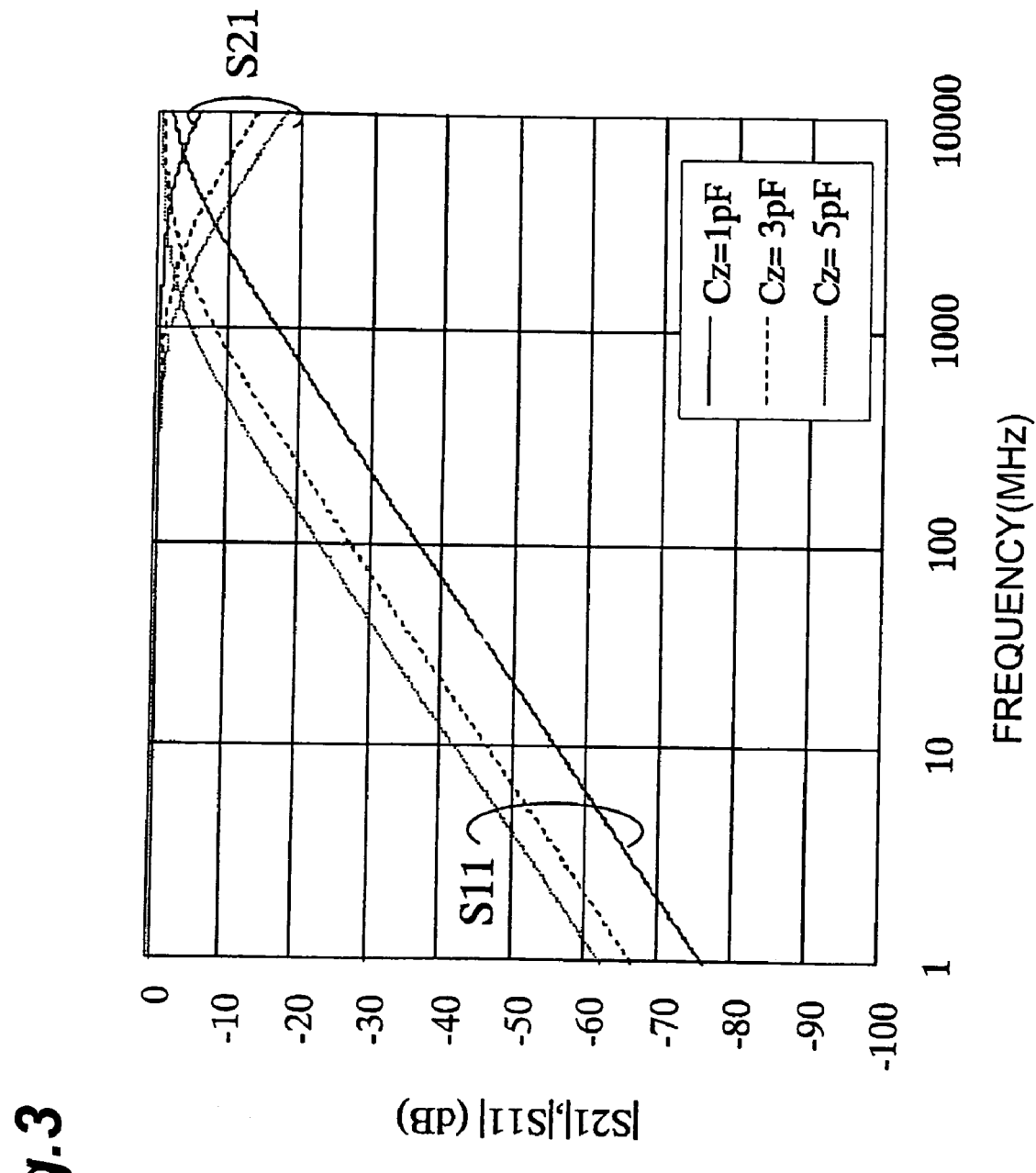
FIG. 3 is a diagram showing the calculation result of S parameters S11 and S21 in a surge absorption circuit expressed by the equivalent circuit in FIG. 2.
Figure 4:
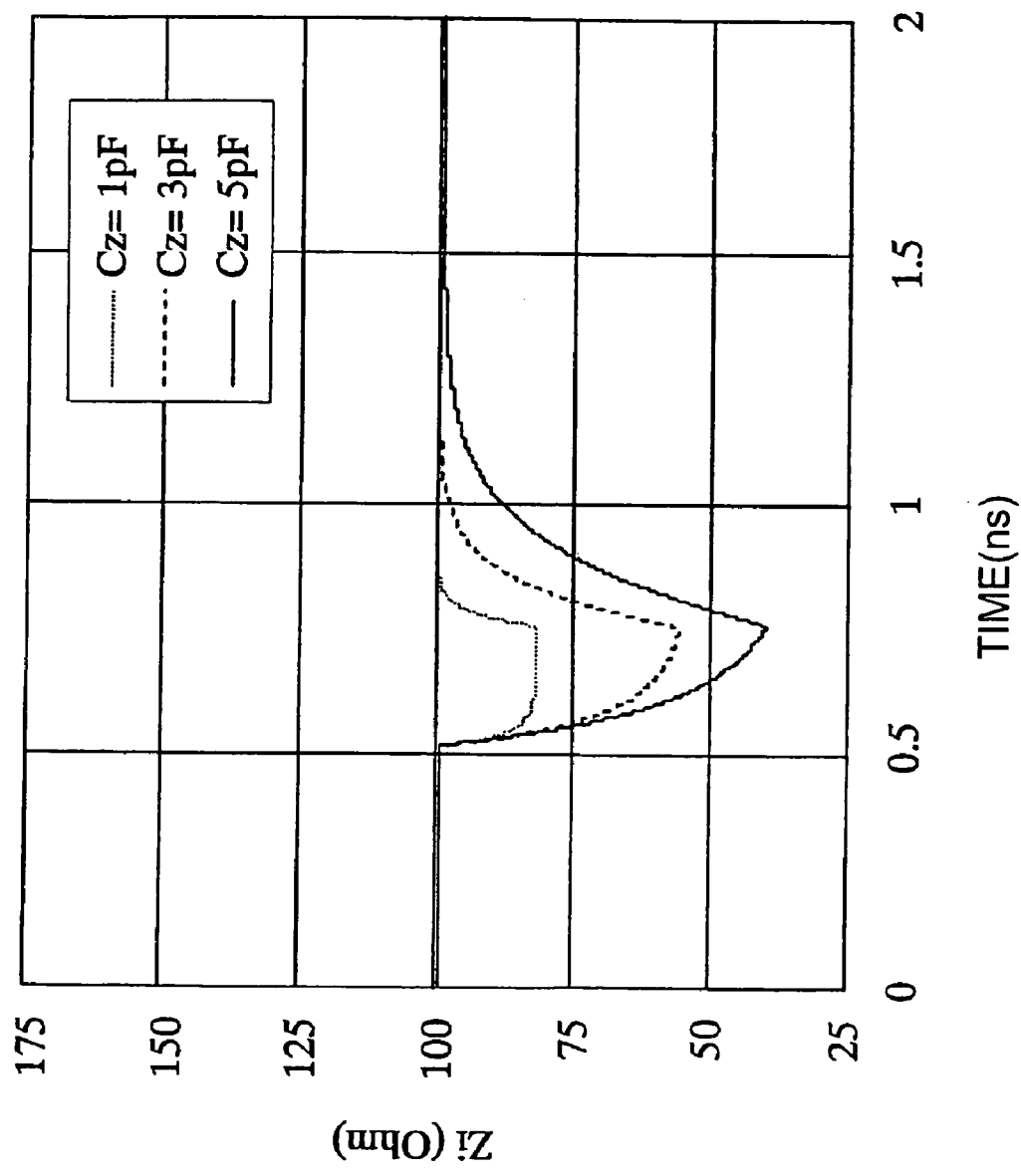
FIG. 4 is a diagram showing the TDR test result of a conventional surge absorption circuit.
Figure 5:
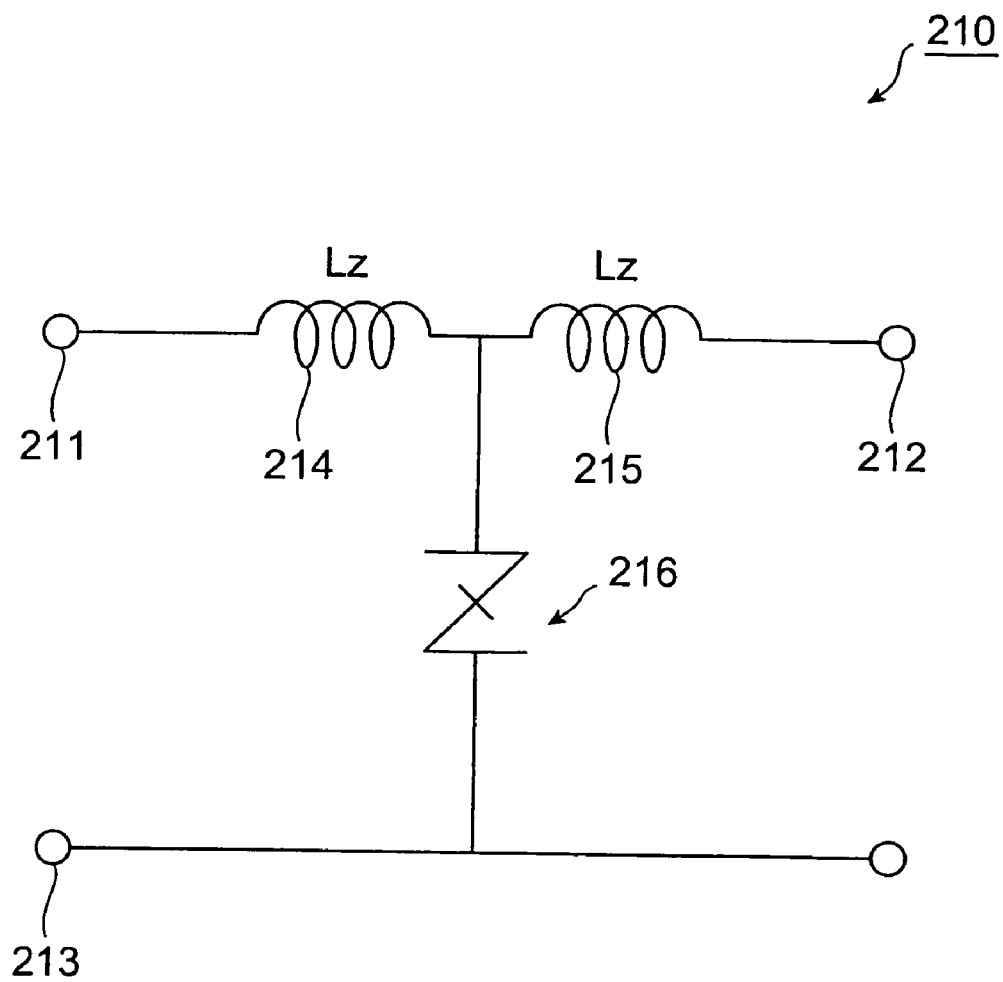
FIG. 5 is a diagram showing an example of a conventional surge absorption circuit in which two inductive elements are combined with a varistor.
Figure 6:
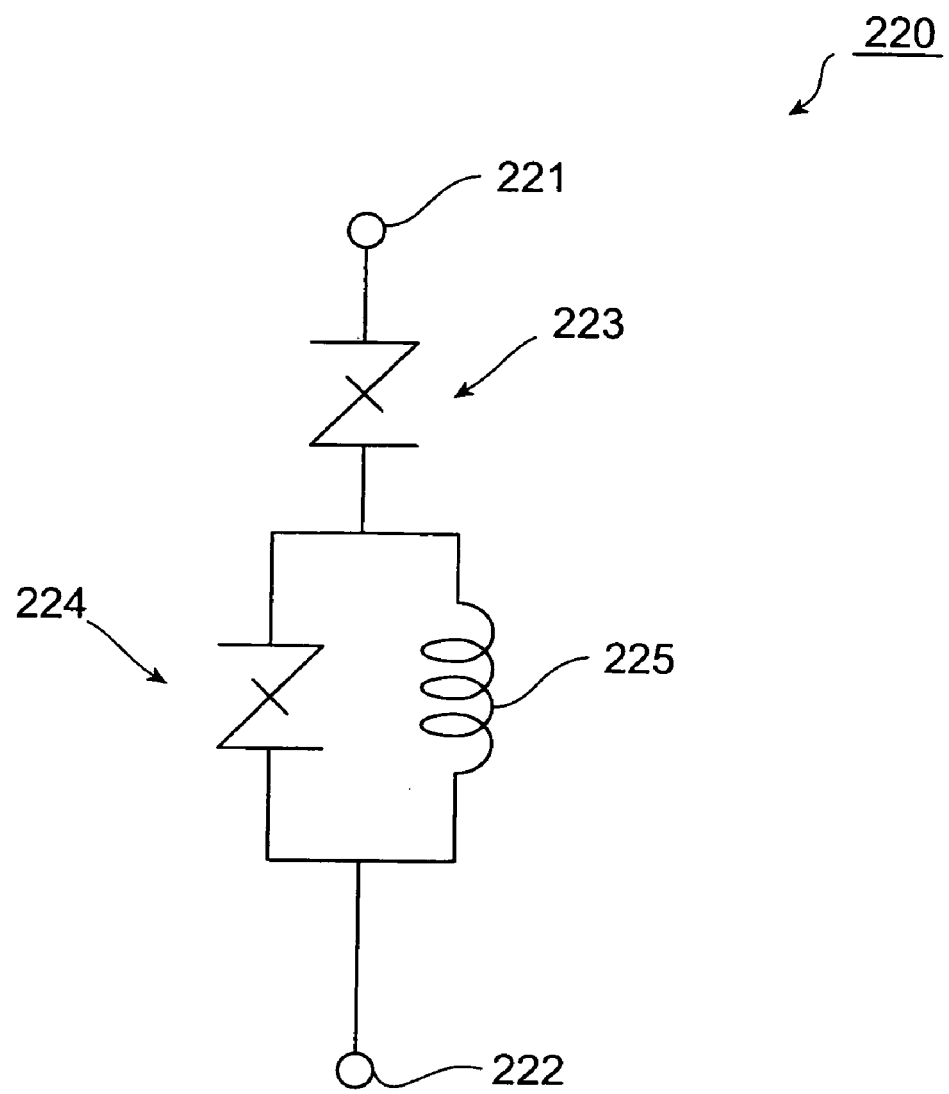
FIG. 6 is a diagram showing an example of a conventional surge absorption circuit in which an inductive element is combined with two varistors.

The input impedance of the surge absorption circuit shown in FIG. 8 is expressed by the following equation (5). The surge absorption element 15 is expressed by the equivalent circuit shown in FIG. 2, but in order to obtain the input impedance Zin of the equation (5), the surge absorption element 15 is approximated only by the stray capacitance 205 of a capacitance Cz.

$$Zin = \sqrt{\frac{2(1+Kz)Lz}{Cz} + \omega^2 Lz^2(Kz^2 - 1)} \qquad (5)$$

When $Kz=\pm 1$, the term including $\omega$ disappears from the right hand side of the equation (5) and therefore the input impedance Zin becomes constant without depending on the frequency. However, when $Kz=-1$, then $Zin=0$, therefore, it is not appropriate. Hence, if $Kz=1$ and the coefficient of induction Lz satisfies the following equation (6), the input impedance Zin matches the characteristic impedance Zo.

$$Lz = \frac{Z_0^2 Cz}{4} \qquad (6)$$

The coupling coefficient and the coefficient of induction can be set as described above, therefore the surge absorption circuit 10 in the present embodiment is capable of protecting a semiconductor device and the like from high voltage static electricity, and is excellent in impedance matching even for a high speed signal.

Figure 9:
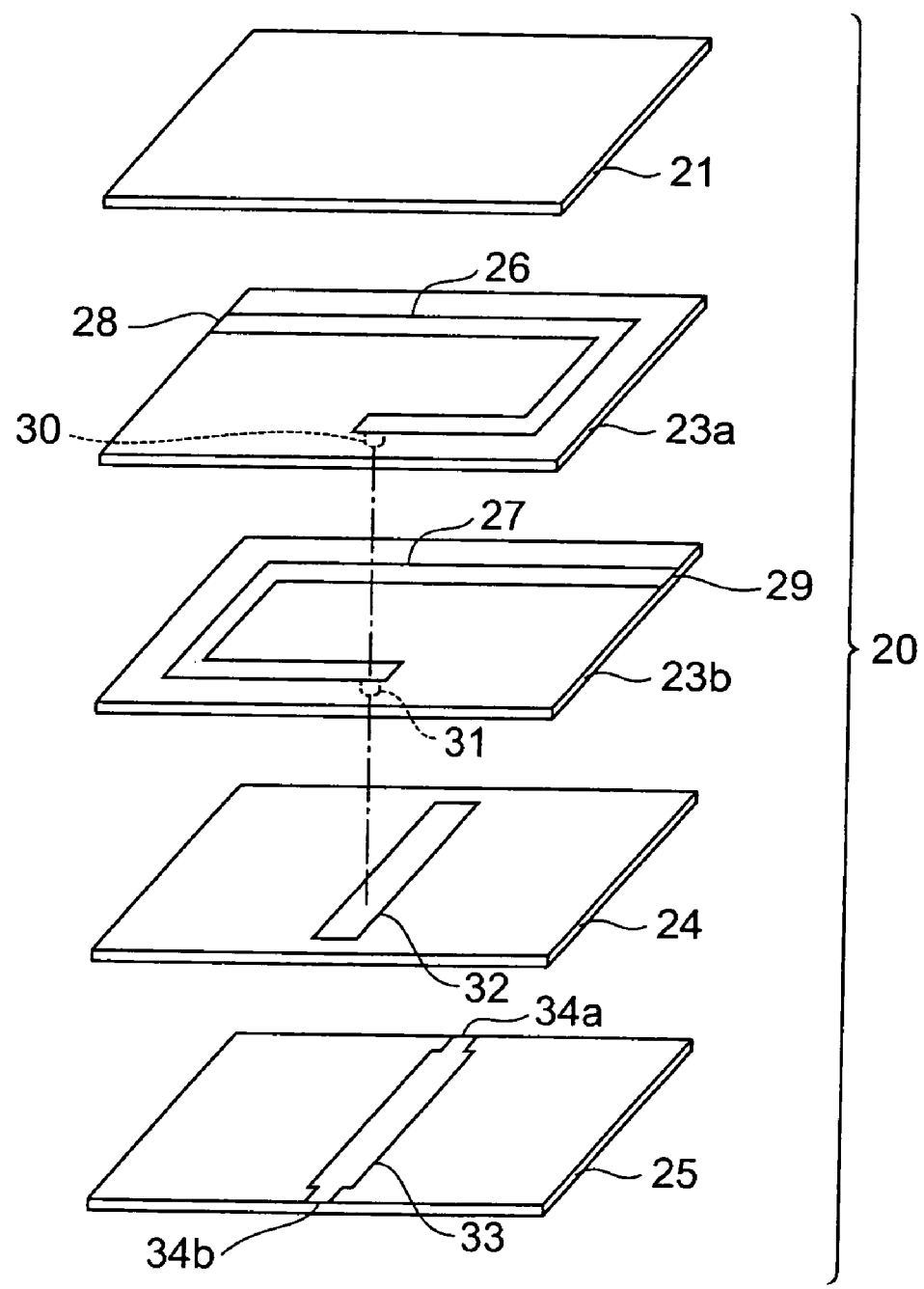
FIG. 9 is an exploded perspective view showing each individual layer of an example of a laminated surge absorption device realized from the surge absorption circuit shown in FIG. 7 as a laminated type device.
Figure 10:
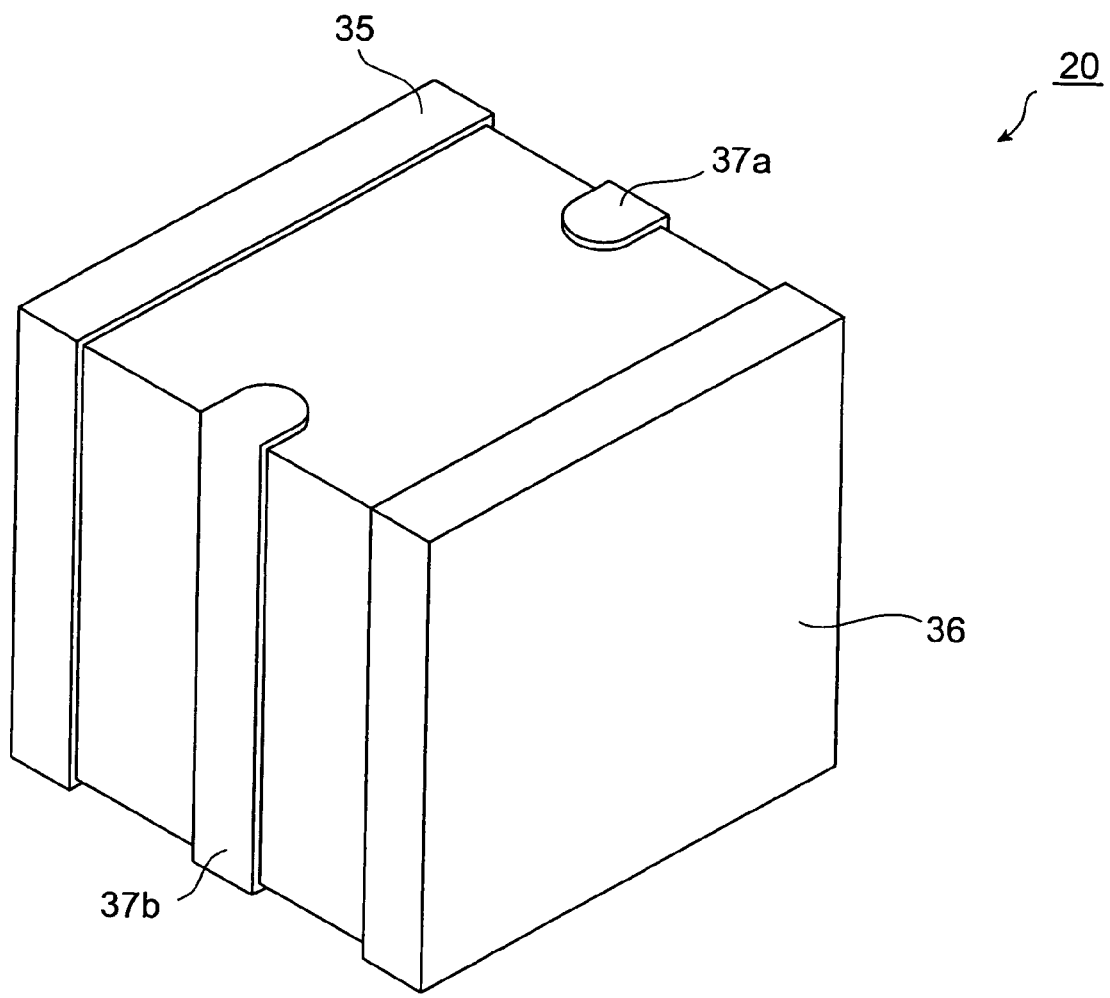
FIG. 10 is a perspective view of an example of a laminated surge absorption device realized from the surge absorption circuit shown in FIG. 7 as a laminated type device.

Next, an example is explained, in which the surge absorption circuit shown in FIG. 7 is realized as a laminated surge absorption device. FIG. 9 is an exploded perspective view showing each individual layer of an example of a laminated surge absorption device realized from the surge absorption circuit shown in FIG. 7 as a laminated type device. FIG. 10 is a perspective view showing an example of a laminated surge absorption device realized from the surge absorption circuit shown in FIG. 7 as a laminated type device.

As shown in FIG. 10, a laminated surge absorption device 20 has a substantially rectangular shape. The laminated surge absorption device 20 has an input electrode 35, an output electrode 36, and common electrodes 37a and 37b on its surface. The input electrode 35 can be used as the input terminal 11, the output electrode 36 as the output terminal 12, and the common electrodes 37a and 37b as the common terminal 13, respectively. Here, the input electrode 35 and the output electrode 36 are distinguished from each other, however, the input side and the output side may be exchanged. Preferably, the common electrode 37a or 37b is grounded.

The laminated surge absorption device 20 includes on its surface a pair of planes extending in the lamination direction of a plurality of layers constituting the laminated surge absorption device and facing with each other. The input electrode 35 is provided on one of the pair of planes and the output electrode 36 is provided on the other plane of the pair of planes.

Further, the laminated surge absorption device 20 includes on its surface another pair of planes extending in the lamination direction described above and facing with each other. The common electrode 37a is provided on one of the other pair of planes and the common electrode 37b is provided on the other plane of the other pair of planes. The common electrode 37a and the common electrode 37b extend in the lamination direction described above.

Hereinafter, the structure and the material of each insulating layer constituting the laminated surge absorption device 20 are explained. As shown in FIG. 9, the laminated surge absorption device 20 has flat-plane-shaped insulating layers 21, 23a, 23b, 24, and 25 laminated in order in the lamination direction described above, mutual inductive element patterns 26 and 27, via holes 30 and 31, and surge absorption element patterns 32 and 33.

For the insulating layers 21, 23a, 23b, 24, and 25, a material with improved insulating properties for the circuit on the surface, for example, a dielectric material such as glass epoxy resin, fluorine contained resin, and ceramic and the like can be used. Each element pattern formed on the surface of the insulating layer may be composed of a conductive material such as gold, platinum, silver, copper, lead, and alloy of these metals and the like, and can be manufactured by printing technology or etching technology.

The insulating layer 21 prevents the internal element pattern from coming into contact with the external. On the surface (one main surface) of the insulating layer 23a, the mutual inductive element pattern 26 forming the primary side (the first inductive element 14a) is formed. The mutual inductive element pattern 26 forms a coil-like shape.

One end 28 of the mutual inductive element pattern 26 is one terminal of the primary side and connected to the input electrode 35 provided on the surface of the laminated surge absorption device 20. The other end of the mutual inductive element pattern 26 is the other terminal of the primary side and connected to the other terminal (the other end of the mutual inductive element pattern 27) of the secondary side (the second inductive element 14b) via the via hole 30 provided in the insulating layer 23a.

The mutual inductive element pattern 27 forming the secondary side is provided on the surface (one main surface) of the insulating layer 23b. The mutual inductive element pattern 27 also forms a coil-like shape. One end 29 of the mutual inductive element pattern 27 is one terminal of the secondary side and connected to the output electrode 36 provided on the surface of the laminated surge absorption device 20. The mutual inductive element pattern 26 and the mutual inductive element pattern 27 constitute a mutual inductive element generating an inductive coupling. In other words, the mutual inductive element pattern 26 and the mutual inductive element pattern 27 are arranged in a positional relationship that increases each inductance.

In this example, the mutual inductive element pattern is formed in a single layer, however, it may be formed in plural layers. If formed in plural layers, it is possible to realize a large coefficient of induction and a large coupling coefficient.

On the surface of the insulating layer 24, the surge absorption element pattern 32 is formed. The surge absorption element pattern 32 is connected to the other end of the mutual inductive element pattern 27 via the via hole 31 provided in the insulating layer 23b.

On the surface of the insulating layer 25, the surge absorption element pattern 33 is formed, and both ends 34a and 34b of the surge absorption element pattern 33 are respectively connected to the common electrodes 37a and 37b provided on the surface of the laminated surge absorption device 20 as the other terminals of the surge absorption element pattern.

The surge absorption element pattern 32 and the surge absorption element pattern 33 are facing with each other, placing the insulating layer 24 therebetween, thereby forming the laminated surge absorption device 15. A via hole is provided in the insulating layer 24 and the via hole is filled with a material showing the varistor characteristics, for example, a semiconductor ceramic material containing ZnO as its main component. Alternatively, a material showing the varistor characteristics, for example, a semiconductor ceramic material containing ZnO as its main component may be used to form the insulating layer 24. In the example shown in FIG. 9, the surge absorption element pattern is formed in a single layer, however, it may be formed in plural layers.

A laminated body as shown in FIG. 10 can be manufactured by integrated baking after the plural layers shown in FIG. 9 are laminated in order and adhered under pressure to each other. On the surface of the laminated body, the input electrode 35, the output electrode 36, and the common electrodes 37a and 37b are formed. As an electrode material, a conductive material such as gold, platinum, silver, copper, lead, and alloy of these metals and the like can be applied.

In the laminated surge absorption device 20 completed in the manner described above, the mutual inductive element and the surge absorption element are formed in integrated manner. Therefore, the laminated surge absorption device 20 can be compact and reduce the stray capacitance. Further, due to the circuit configuration of the surge absorption circuit 10 described above, the laminated surge absorption device 20 is capable of protecting a semiconductor device or the like from high voltage static electricity, and is excellent in impedance matching even for a high speed signal.

Figure 11:
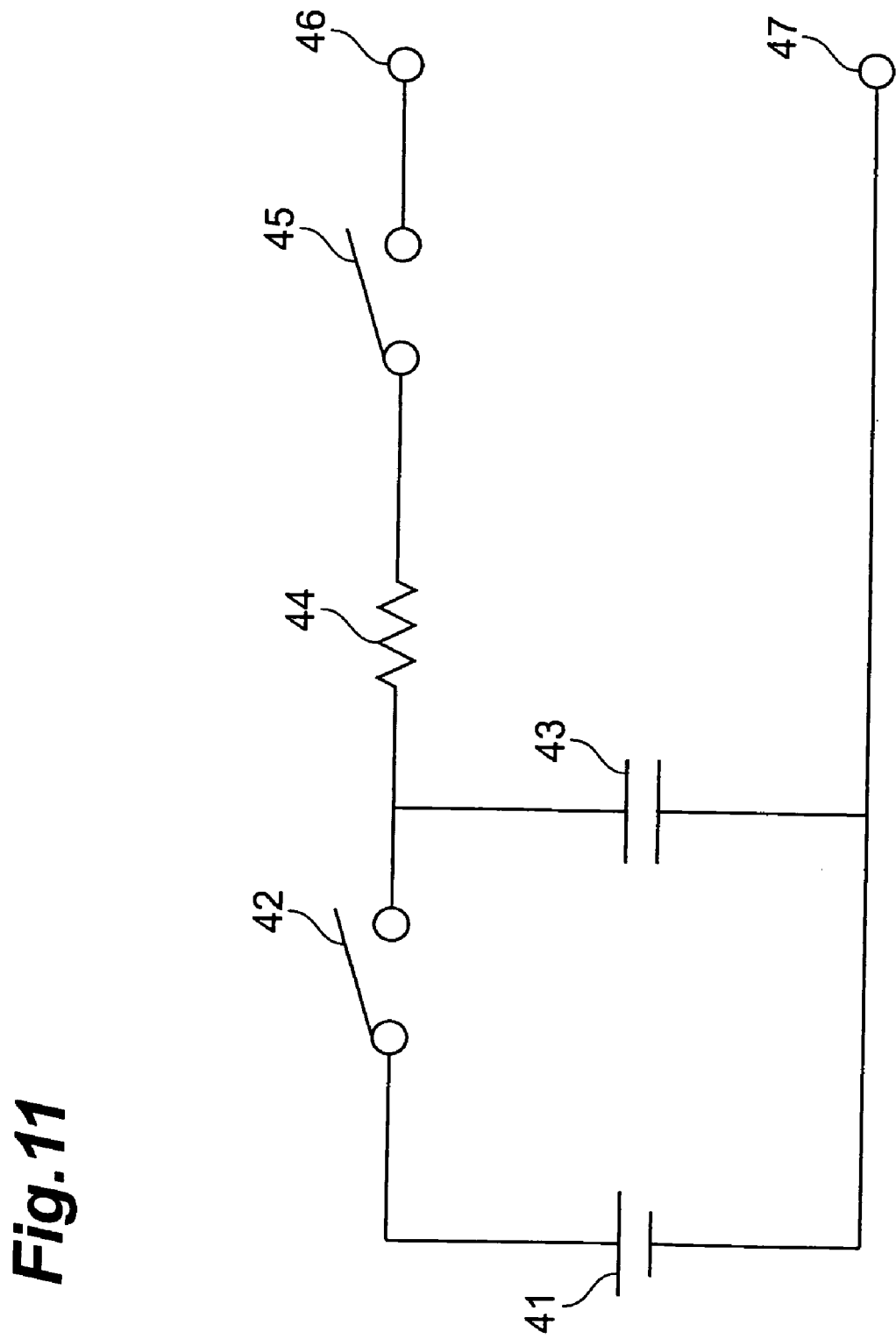
FIG. 11 is a diagram showing a circuit of a surge test apparatus.

Hereinafter, the surge test conducted to the laminated surge absorption device 20 described above is explained. FIG. 11 is a diagram showing a circuit of a surge test apparatus. The surge test apparatus shown in FIG. 11 is designed so as to have a direct current voltage source 41, a switch 42, a capacitive element 43, a resistor 44, a switch 45, and output terminals 46 and 47.

Between the output terminal 46 and the output terminal 47 of the surge test apparatus, a load circuit is connected, in which the laminated surge absorption device 20 and a load resistor (for example, 50 Ω) is connected in parallel. Specifically, the input electrode 35 of the laminated surge absorption device 20 is connected to the output terminal 46, and the common electrode 37a or 37b of the laminated surge absorption device 20 is connected to the output terminal 47. Further, one terminal of the load resistor is connected to the output electrode 36 of the laminated surge absorption device 20, and the other terminal of the load resistor is connected to the common electrode 37a or 37b of the laminated surge absorption device 20. Furthermore, the capacitance of the capacitive element 43 is set to 150 pF and the resistance of the resistor 44 is set to 330 Ω. Then, a voltage of 2 kV from the direct current voltage source 41 is supplied.

First, in a state in which the switch 45 was left in an open state, the switch 42 was closed and the capacitive element 43 was charged from the direct current voltage source 41. Next, the switch 42 was opened and the switch 45 was closed, then the electric charges charged in the capacitive element 43 were applied to the load circuit composed of the laminated surge absorption device 20 and the load resistor via the resistor 44. At this time, the voltage applied to the load circuit was measured.

Figure 12:
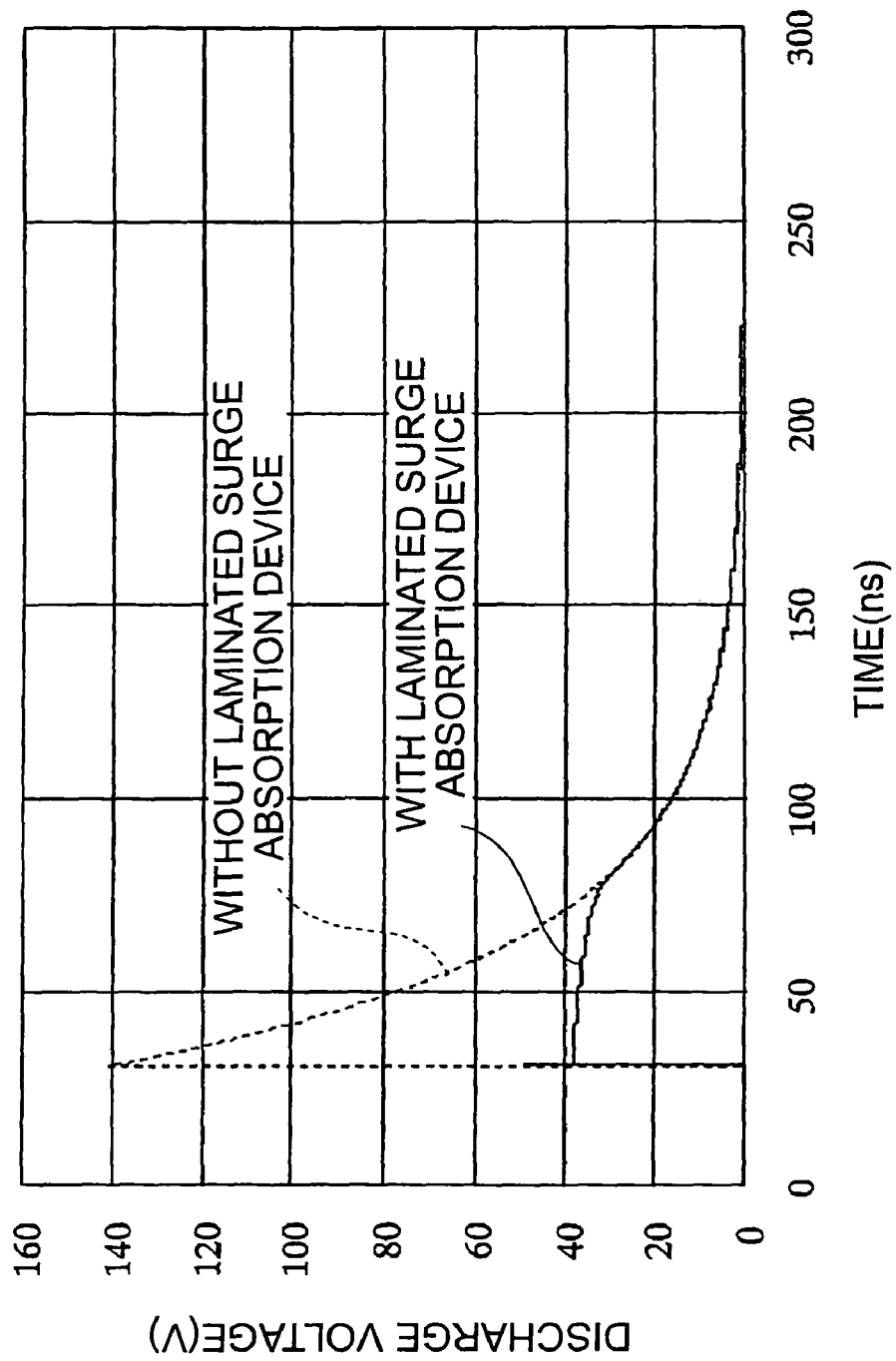
FIG. 12 is a diagram showing the result of the measurement of the voltage applied to a load circuit composed of the laminated surge absorption device shown in FIG. 9 and a load resistor.

The measurement result is shown in FIG. 12. In FIG. 12, the horizontal axis represents time (ns) and the vertical axis represents a discharge voltage (V), and the discharge voltage is compared with and without the laminated surge absorption device 20. From FIG. 12, it can be seen that a surge is sufficiently absorbed by adding the laminated surge absorption device 20 of the present embodiment. Therefore, the laminated surge absorption device 20 having the configuration of the surge absorption circuit 10 of the present embodiment has high performance surge absorption characteristics and is compact and excellent in impedance matching even for a high speed signal.

Second Embodiment

Figure 13:
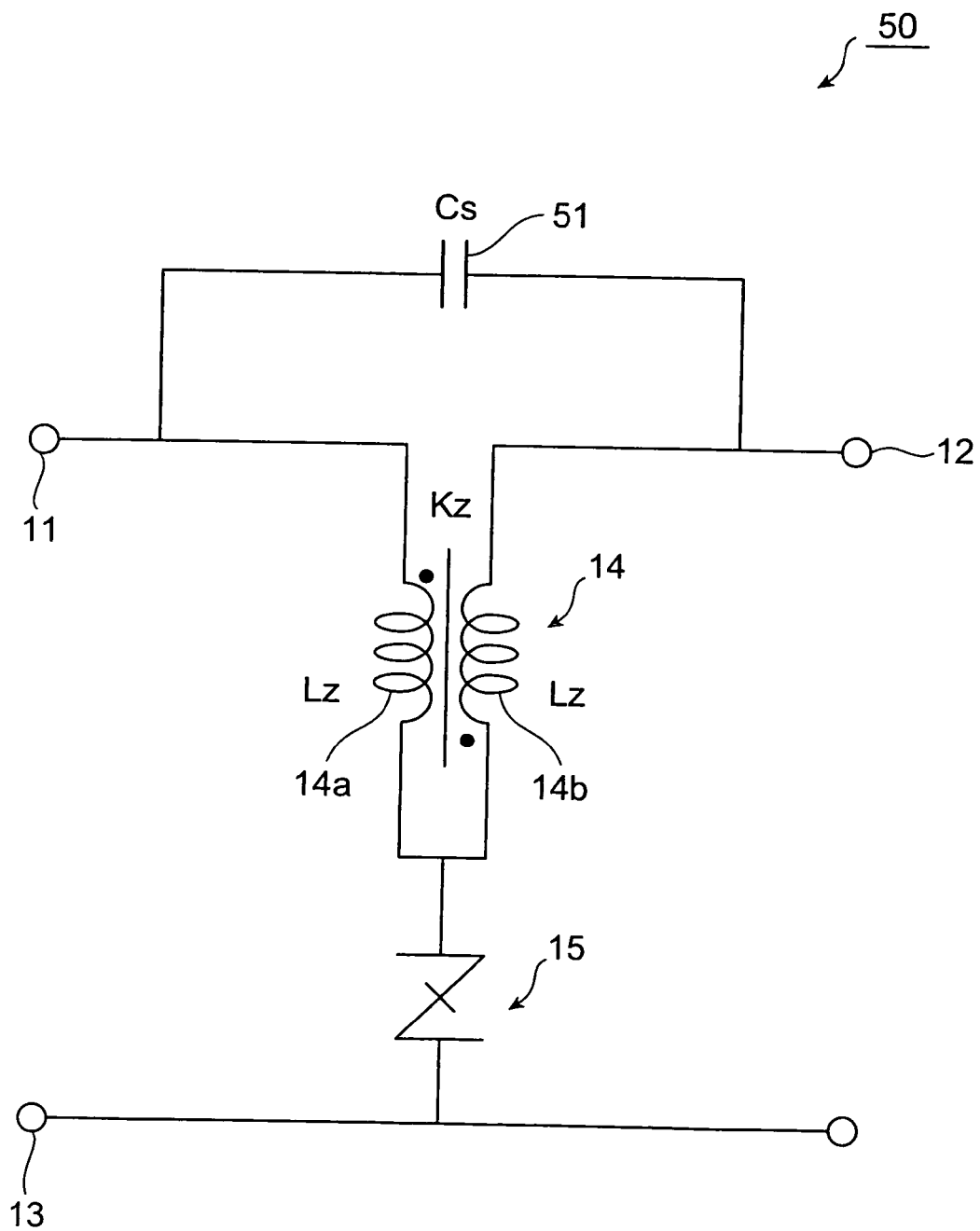
FIG. 13 is a diagram showing a circuit configuration of a surge absorption circuit according to a second embodiment of the present invention.

FIG. 13 is a diagram showing a circuit configuration of a surge absorption circuit according to a second embodiment of the present invention. A surge absorption circuit 50 shown in FIG. 13 comprises the input terminal 11, the output terminal 12, the common terminal 13, the mutual inductive element 14, the surge absorption element 15, and a capacitive element 51.

The surge absorption circuit 50 is the surge absorption circuit 10 in the first embodiment, to which the capacitive element 51 to be connected between the input terminal 11 and the output terminal 12 is added.

Here, the input terminal 11 and the output terminal 12 are distinguished from each other, however, the input side and the output side may be exchanged. Preferably, the common terminal 13 is grounded.

In the following explanation, it is assumed that the inductance of each of the first inductive element 14a and the second inductive element 14b of the mutual inductive element 14 is Lz, the coupling coefficient of the first inductive element 14a and the second inductive element 14b is Kz, and the capacitance of the capacitive element 51 is Cs. The mutual inductive element 14 can be realized by, for example, a common mode choke coil or a transformer.

Figure 14:
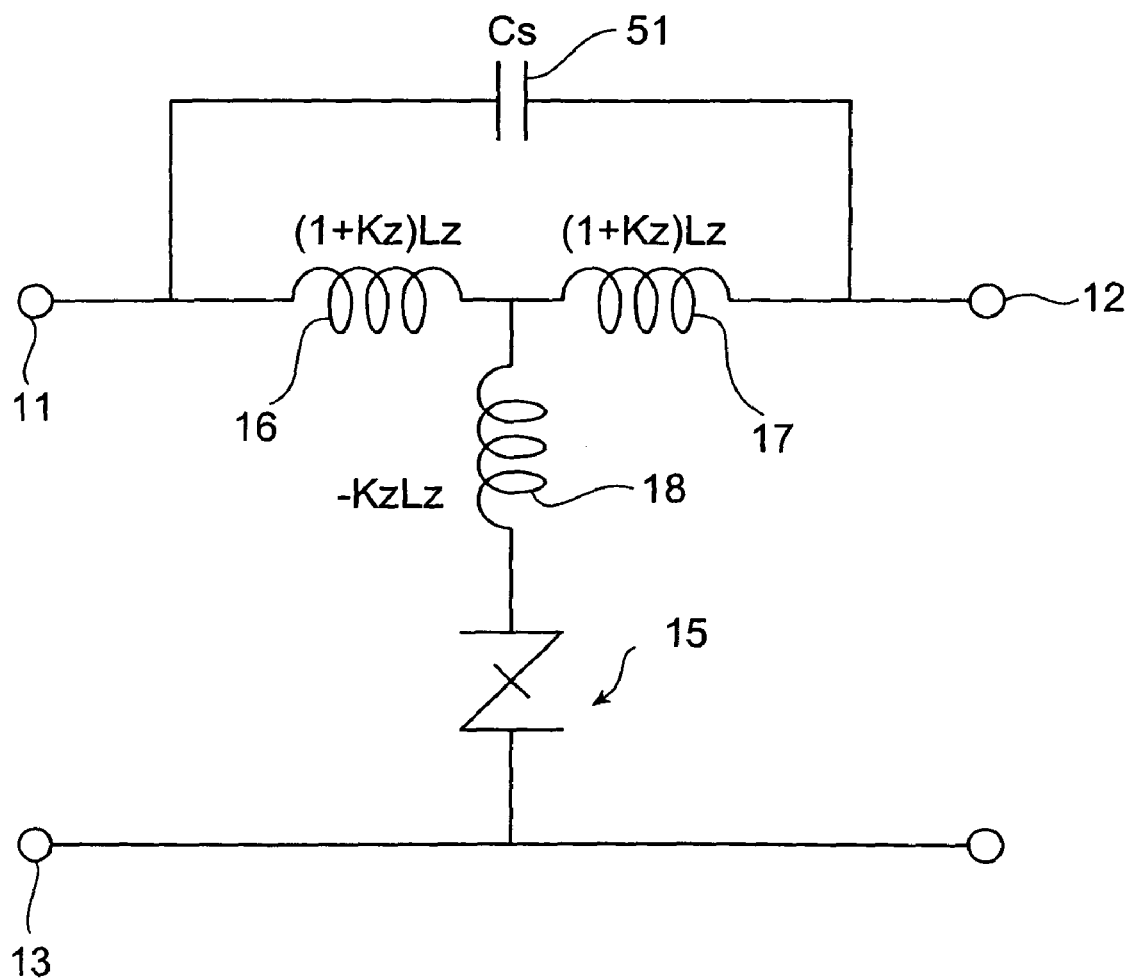
FIG. 14 is a diagram showing an equivalent circuit of the surge absorption circuit shown in FIG. 13.

FIG. 14 is a diagram showing an equivalent circuit of the surge absorption circuit shown in FIG. 13. The surge absorption circuit 50 can be equivalently converted into the circuit configuration in FIG. 14. In FIG. 14, the same symbol as that in FIG. 13 represents the same meaning. In the equivalent circuit shown in FIG. 14, the inductive elements 16 and 17 are connected in series between the input terminal 11 and the output terminal 12. The inductive element 18 and the surge absorption element 15 are connected in series between the middle point of the inductive elements 16 and 17 connected in series and the common terminal 13. The capacitive element 51 is connected between the input terminal 11 and the output terminal 12. The coefficient of induction of each of the inductive elements 16 and 17 is (1+Kz) Lz, the coefficient of induction of the inductive element 18 is −KzLz, and the capacitance of the capacitive element 51 is Cs.

The input impedance of the surge absorption circuit 50 in FIG. 14 is expressed by the following equation (7). Here, the surge absorption element 15 is expressed by the equivalent circuit shown in FIG. 2, however, for a high speed signal with a small amplitude, it is approximated only by the stray capacitance 205 of the capacitor Cz.

$$Zin = \sqrt{\frac{2(1+Kz)Lz}{Cz} \frac{1-\omega^2 Lz((1-Kz)Cz/2)}{1-\omega^2 Lz(2(1+Kz)Cs)}} \quad (7)$$

If Cs shown in the equation (7) is set so as to satisfy the following equation (8), the input impedance Zin no longer depends on frequency. If Cs is set to the capacitance shown in the equation (8) and Lz is set as shown in the following equation (9), the input impedance Zin can be matched to the characteristic impedance Zo.

$$Cs = \frac{1-Kz}{4(1+Kz)}Cz \qquad (8)$$

$$Lz = \frac{Z_0^2 Cz}{2(1+Kz)} \qquad (9)$$

As understood from the above-mentioned equations (8) and (9), it is possible to design the surge absorption circuit 50 more flexibly than the surge absorption circuit 20 because the coupling coefficient Kz can be selected more flexibly.

Therefore, the surge absorption circuit 50 in the present embodiment is capable of protecting a semiconductor device and the like from high voltage static electricity and is excellent in impedance matching even for a high speed signal.

Figure 15:
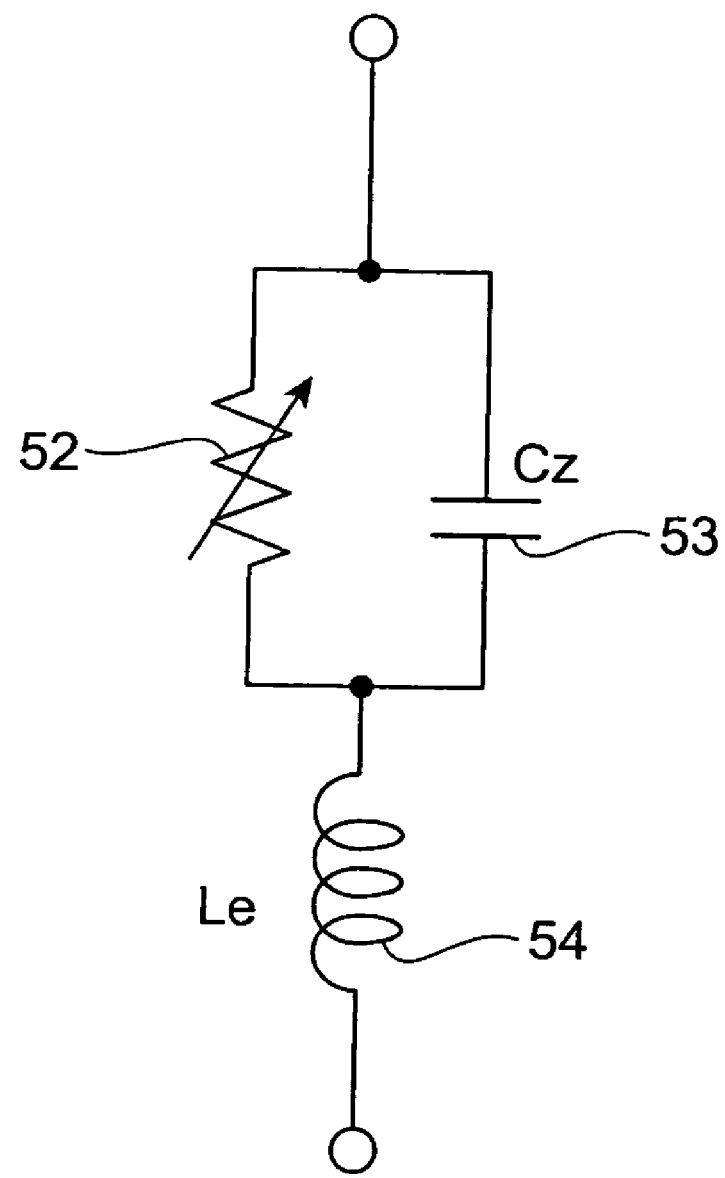
FIG. 15 is a diagram showing an equivalent circuit of a surge absorption element.

A surge absorption element actually includes a stray inductive component. An equivalent circuit of a surge absorption element including a stray capacitive component and a stray inductive component is shown in FIG. 15. In the equivalent circuit shown in FIG. 15, a parallel circuit of a variable resistor 52 and a stray capacitive component 53 is connected in series to a stray inductive component 54. The resistance of the variable resistor 52 is normally large and becomes small when a high voltage surge is applied. Therefore, the surge absorption element is capable of protecting a semiconductor device from a high voltage surge. However, there exist the stray capacitive component 53 and the stray inductive component 54 in the surge absorption element. Because of this, if the surge absorption circuit is added to the input side of a semiconductor device that deals with a high speed signal as an input signal, the high speed signal is caused to degrade.

Figure 16:
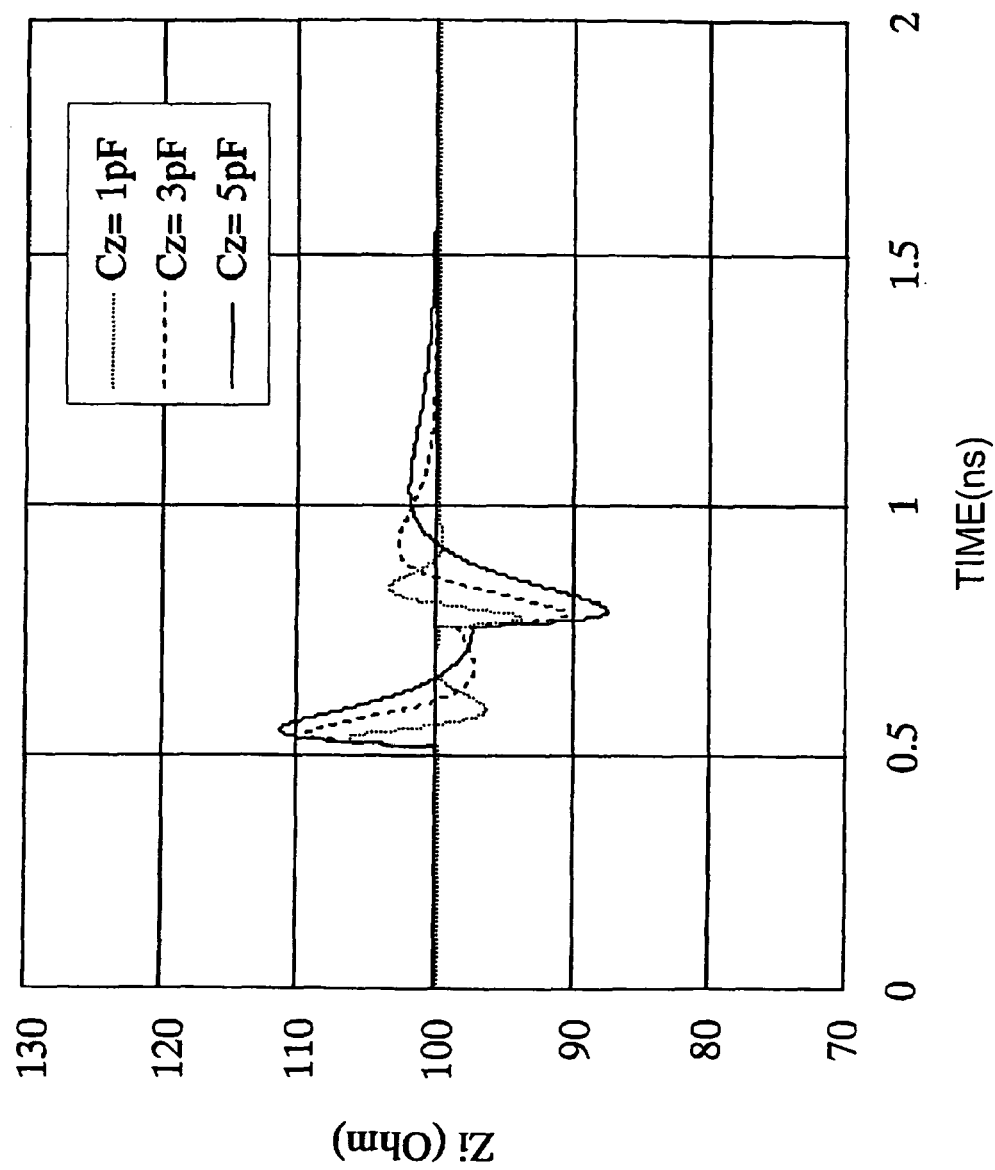
FIG. 16 is a diagram showing the TDR test result when a stray inductive component is added to the surge absorption circuit shown in FIG. 13.

FIG. 16 is a diagram showing the TDR test result of the surge absorption circuit shown in FIG. 13. The TDR (Time Domain Reflectometry) test result when a stray inductive component having the coefficient of induction Le=0.5 nH is added to the surge absorption element that has been designed optimally in the surge absorption circuit shown in FIG. 13 is shown in FIG. 16 for the capacitance Cz of the stray capacitive component 1 pF, 3 pF, and 5 pF, respectively. The input impedance Zi for a pulse signal with rise time and fall time of 200 ps and a signal amplitude 1 $V_{0\text{-}p}$ degrades to 90 to 110 Ω compared to 100 Ω in the constant state when the stray capacitance is 5 pF. Even if the stray capacitance is 1 pF, it degrades to 95 to 105 Ω.

As described above, in order to apply a surge absorption circuit to a circuit that deals with a high speed signal, it is preferable to reduce the influence of not only the stray capacitive component but also the stray inductive component.

On the other hand, as known from the equivalent circuit shown in FIG. 14, by utilizing the inductive element 18 with a negative coefficient of induction, it is possible to cancel the stray inductive component included in the surge absorption element. However, a state in which coupling becomes weak apparently is brought about, then Cs is set as shown in the following (10) while leaving Kz and Lz unchanged. Here, KzLz≧Le.

$$Cs = \frac{1 - Kz + 2Le/Lz}{4(1+Kz)}Cz \qquad (10)$$

If designed as described above, it is possible to mach the input impedance Zin to the characteristic impedance Zo even if the stray capacitive component and the stray inductive component are included in the surge absorption element.

Therefore, the surge absorption circuit 50 in the present embodiment is capable of protecting a semiconductor device and the like from high voltage static electricity, and is excellent in impedance matching even for a high speed signal.

Figure 17:
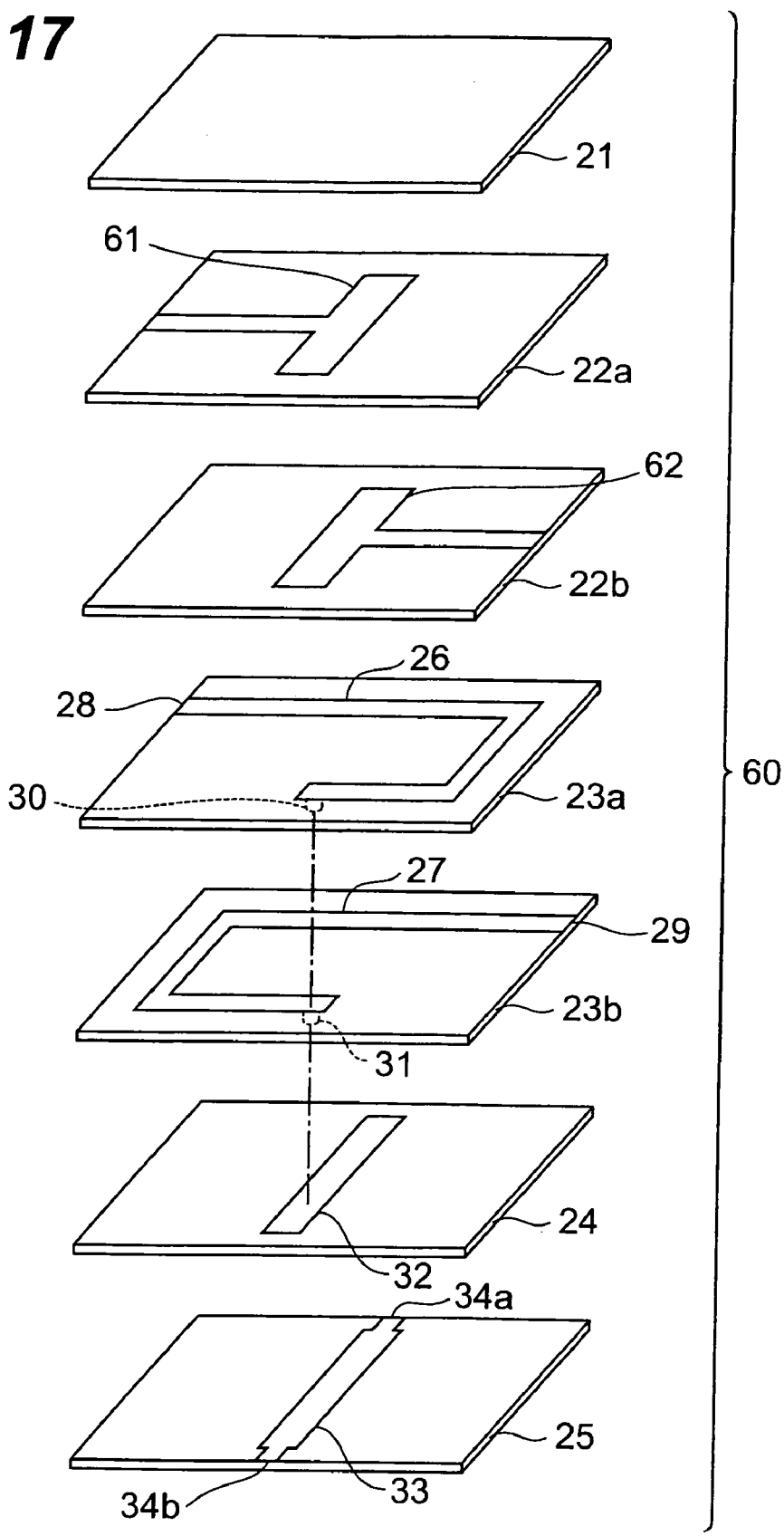
FIG. 17 is an exploded perspective view showing each individual layer of a laminated surge absorption device realized from the surge absorption circuit shown in FIG. 13 as a laminated type device.

Next, an example is explained, in which the surge absorption circuit explained in FIG. 13 is realized as a laminated surge absorption device. FIG. 17 is an exploded perspective view showing each individual layer of a laminated surge absorption device realized from the surge absorption circuit shown in FIG. 13 as a laminated type device.

A laminated surge absorption device 60 shown in FIG. 17 has flat-plane-shaped insulating layers 22a and 22b, and capacitive element patterns 61 and 62, in addition to the same components as those of the laminated surge absorption device 20.

The insulating layers 22a and 22b are provided between the insulating layer 21 and the insulating layer 23a. The capacitive element pattern 61 is provided one main surface of the insulating layer 22a and the capacitive element pattern 62 is provided on one main surface of the insulating layer 22b. A part of the capacitive element pattern 61 and a part of the capacitive element pattern 62 are facing with each other, placing the insulating layer 22a therebetween, thereby constituting the capacitive element 51.

The laminated surge absorption device 60 has the same external shape as that of the laminated surge absorption device 20 and has the same electrodes as that of the laminated surge absorption device 20 on its surface. One end of the capacitive element pattern 61 is connected to the input electrode 35 and one end of the capacitive element pattern 62 is connected to the output electrode 36.

In the laminated surge absorption device 60, the mutual inductive element pattern 26 and the capacitive element pattern 61 are formed in the different insulating layers, and the mutual inductive element pattern 27 and the capacitive element pattern 62 are formed in the different insulating layers. However, they may be formed in the same insulating layers, respectively. Further, the line widths of the mutual inductive element pattern 26 and the mutual inductive element pattern 27 may be increased and used as a capacitive element pattern.

In the laminated surge absorption device 60 described above, the mutual inductive element and the surge absorption element are formed in integrated manner. Therefore, the laminated surge absorption device 60 can be made compact and its stray capacitance can be reduced. Further, due to the circuit configuration of the surge absorption circuit 50 described above, the laminated surge absorption device 60 is capable of protecting a semiconductor device and the like from high voltage static electricity and is excellent in impedance matching even for a high speed signal. The surge test result of the laminated surge absorption device 60 was as excellent as the laminated surge absorption device 20 in the first embodiment.

Third Embodiment

Figure 18:
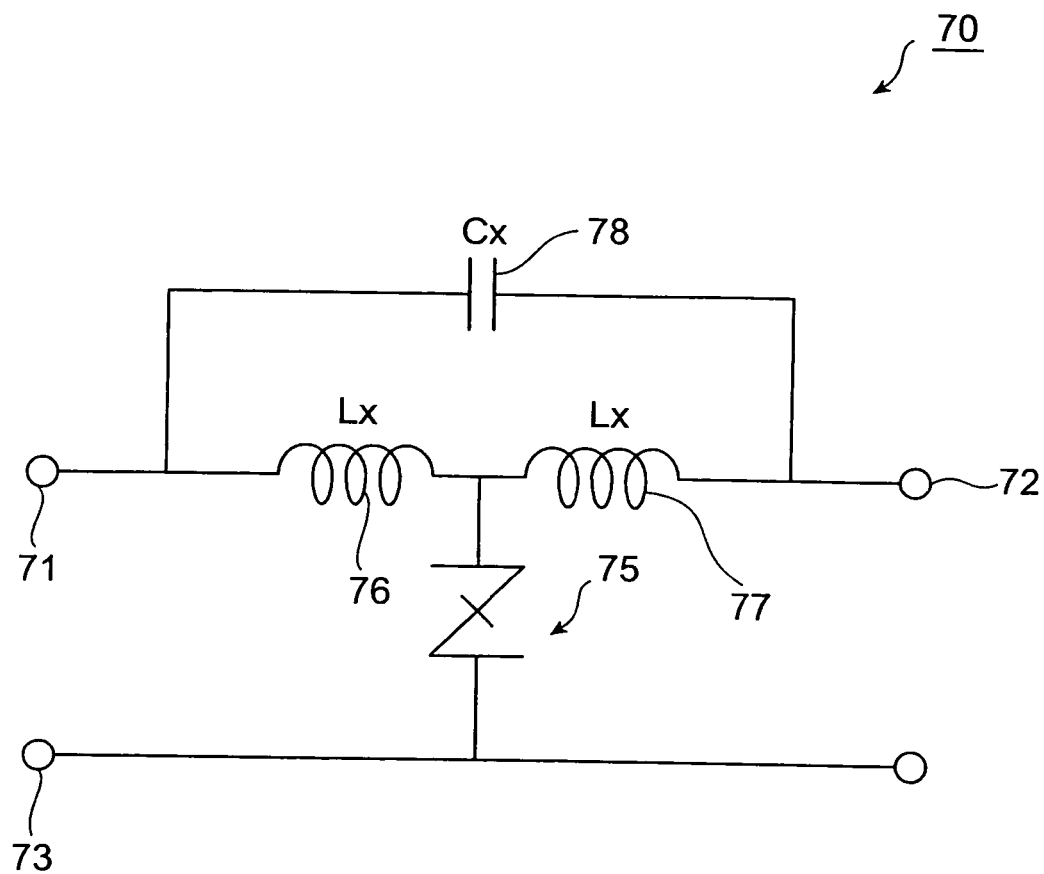
FIG. 18 is a diagram showing a circuit configuration of a surge absorption circuit according to a third embodiment of the present invention.

FIG. 18 is a diagram showing a circuit configuration of a surge absorption circuit according to a third embodiment of the present invention. A surge absorption circuit 70 shown in FIG. 18 comprises an input terminal 71, an output terminal 72, a common terminal 73, a surge absorption element 75, inductive elements 76 and 77, and a capacitive element 78.

The input terminal 71, the output terminal 72, and the common terminal 73 are provided for connection with the external. The two inductive elements 76 and 77 are connected in series between the input terminal 71 and the output terminal 72. The capacitive element 78 is connected between the input terminal 71 and the output terminal 72. The two inductive elements 76 and 77 may not be coupled electromagnetically. In other words, the coupling coefficient of the two inductive elements 76 and 77 may be less than 0.01.

One terminal of the surge absorption element 75 is connected to the connection point of the inductive element 76 and the inductive element 77. The other terminal of the surge absorption element 75 is connected to the common terminal 73. To the surge absorption element 75, a varistor utilizing a metal oxide such as ZnO, a PN junction element utilizing a semiconductor such as Si, a surge absorption element utilizing molybdenum, a gap type discharge element utilizing discharge between electrodes and the like can be applied.

Here, the input terminal 71 and the output terminal 72 are distinguished from each other, however, the input side and the output side may be exchanged. Preferably, the common terminal 73 is grounded.

In the following explanation, it is assumed that the inductance of each of the inductive elements 76 and 77 is Lx and the capacitance of the capacitive element 78 is Cx.

The input impedance of the surge absorption circuit in FIG. 18 is expressed by the following equation (11). The surge absorption element 75 is expressed by the equivalent circuit shown in FIG. 2, however, it is approximated only by the stray capacitance 205 of the capacitance Cz for a high speed signal with a small amplitude.

$$Zin = \sqrt{\frac{2Lx}{Cz} \frac{1 - \omega^2 Lx(Cz/2)}{1 - \omega^2 Lx(2Cx)}} \quad (11)$$

If Cx is set so as to satisfy the following equation (12), the input impedance Zin shown in the equation (11) no longer depends on frequency. If Cx is set as shown in the equation (12) and Lx is set as shown in the following equation (13), it is possible to match the input impedance Zin to the characteristic impedance Zo.

$$Cx = \frac{Cz}{4} \quad (12)$$

$$Lx = \frac{Z_0^2 Cz}{2} \quad (13)$$

Therefore, the surge absorption circuit 70 in the present embodiment is capable of protecting a semiconductor device and the like from high voltage static electricity and is excellent in impedance matching even for a high speed signal.

Figure 19:
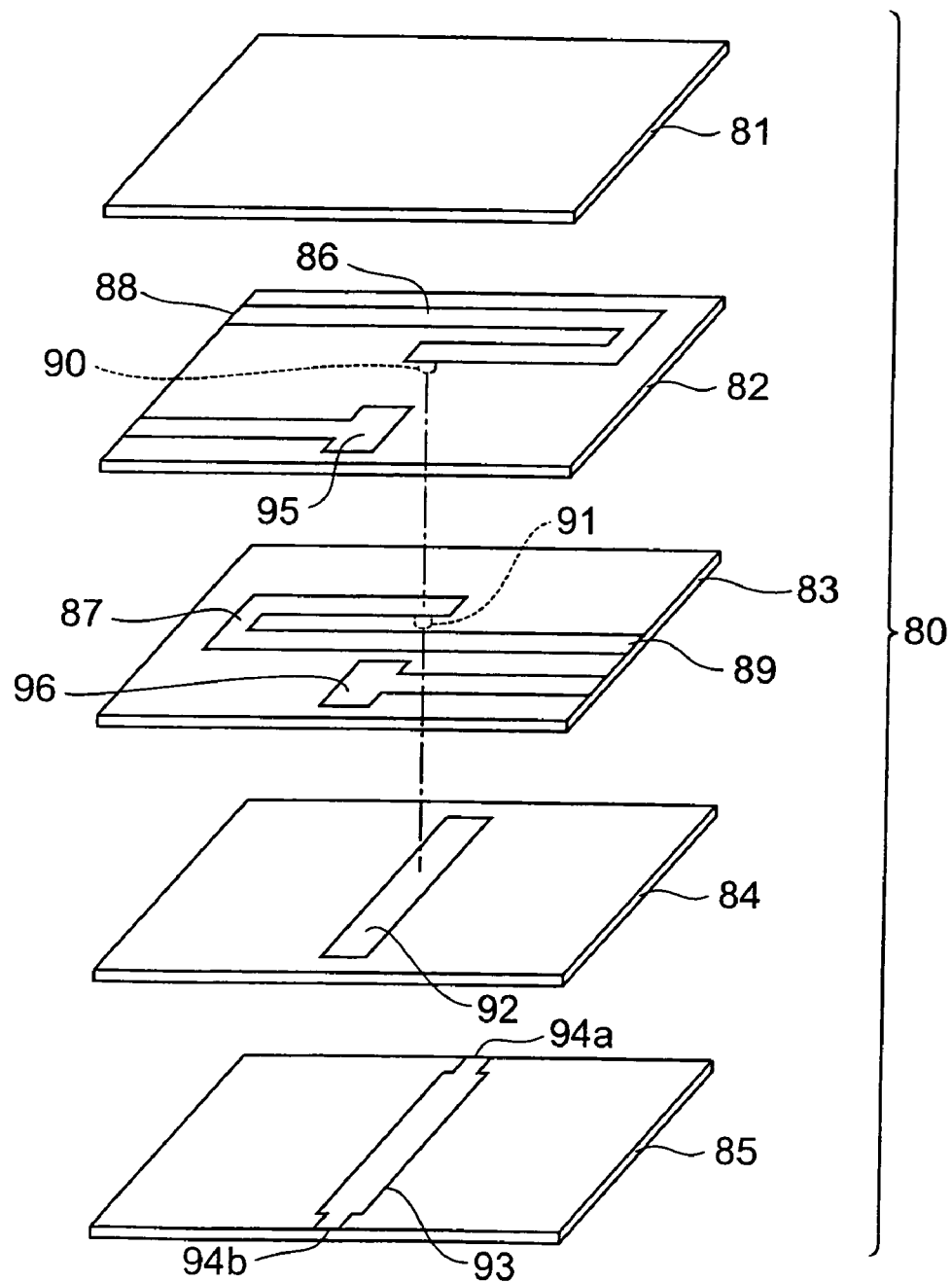
FIG. 19 is an exploded perspective view showing each individual layer of an example of a laminated surge absorption device realized from the surge absorption circuit shown in FIG. 18 as a laminated type device.

Next, an example is explained, in which the surge absorption circuit 70 is realized as a laminated surge absorption device. FIG. 19 is an exploded perspective view showing each individual layer of an example of a laminated surge absorption device realized from the surge absorption circuit shown in FIG. 18 as a laminated type device.

A laminated surge absorption device 80 shown in FIG. 19 has flat-plane-shaped insulating layers 81, 82, 83, 84, and 85, inductive element patterns 86 and 87, via holes 90 and 91, surge absorption element patterns 92 and 93, and capacitive element patterns 95 and 96. The external shape of the laminated surge absorption device 80 and the electrode pattern on the surface are the same as those in the first embodiment explained in FIG. 10.

The insulating layer 81 prevents the internal element pattern from coming into contact with the external. On one main surface of the insulating layer 82, the inductive element pattern 86 is formed. The inductive element pattern 86 is used as the inductive element 76. One end 88 of the inductive element pattern 86 is used as one terminal to be connected to the input electrode. The other end of the inductive element pattern 86 is connected to the other end of the inductive element pattern 87 via the via hole 90 provided in the insulating layer 82.

The inductive element pattern 87 is formed on one main surface of the insulating layer 83. The inductive element pattern 87 is used as the inductive element 77. One end 89 of the inductive element pattern 87 is used as one terminal to be connected to the output electrode. The other end of the inductive element pattern 87 is connected to the surge absorption element pattern 92 via the via hole 91 provided in the insulating layer 83. The inductive element pattern 86 and the inductive element pattern 87 are arranged such that they are not coupled electromagnetically, that is, the coupling coefficient is less than 0.01.

The surge absorption element pattern 92 is provided on one main surface of the insulating layer 84. The surge absorption element pattern 93 is provided on one main surface of the insulating layer 85. The surge absorption element pattern 92 and the surge absorption element pattern 93 are facing with each other, placing the insulating layer 84 therebetween, thereby constituting the surge absorption element 75. One end 94a and another end 94b of the surge absorption element pattern 93 are used as the other terminal of the surge absorption element to be connected to the common electrode.

The capacitive element pattern 95 is provided on one main surface of the insulating layer 82. The capacitive element pattern 96 is provided on one main surface of the insulating layer 83. A part of the capacitive element pattern 95 and a part of the capacitive element pattern 96 are facing with each other, thereby constituting the capacitive element 78. One end of the capacitive element pattern 95 is connected to the input electrode, and one end of the capacitive element pattern 96 is connected to the output electrode.

The structure and material of each insulating layer constituting the laminated surge absorption device 80 in FIG. 19 are the same as those of the laminated surge absorption device 20 in FIG. 10. In the laminated surge absorption device 80 shown in FIG. 19, the inductive element pattern 86 and the capacitive element pattern 95 are formed on the same insulating layer, and the inductive element pattern 87 and the capacitive element pattern 96 are formed on the same insulating layer. However, they may be formed in different layers, respectively. Further, the line widths of the inductive element pattern 86 and the inductive element pattern 87 may be increased and used as a capacitive element pattern.

The external shape of the laminated surge absorption device 80 is the same as that explained in FIG. 10. To the input electrode 35 shown in FIG. 10, the one end 88 (one of terminals) of the inductive element pattern 86 and the terminal (one end) of the capacitive element pattern 95 explained in FIG. 19 are connected. To the output electrode 36, the one end 89 (one of terminals) of the inductive element pattern 87 and the terminal (one end) of the capacitive element pattern 96 are connected. To the common electrode 37a and 37b, both the ends 94a and 94b (the other terminal of the surge absorption element 75) of the surge absorption element pattern 93 are connected respectively. Here, the input electrode 35 and the output electrode 36 are distinguished from each other, however, the input side and the output side may be exchanged. Preferably, the common electrode 37a or 37b is grounded.

In the laminated surge absorption device 80 completed as described above, the mutual inductive element and the surge absorption element are formed in integrated manner. Therefore, the laminated surge absorption device 80 can be made compact and its stray capacitance can be reduced. Further, due to the circuit configuration of the surge absorption circuit 70 described above, the laminated surge absorption device 80 is capable of protecting a semiconductor device and the like from high voltage static electricity and is excellent in impedance matching even for a high speed signal. By the way, the surge test result of the laminated surge absorption device 80 was as excellent as the laminated surge absorption device 20 in the first embodiment.

Fourth Embodiment

Figure 20:
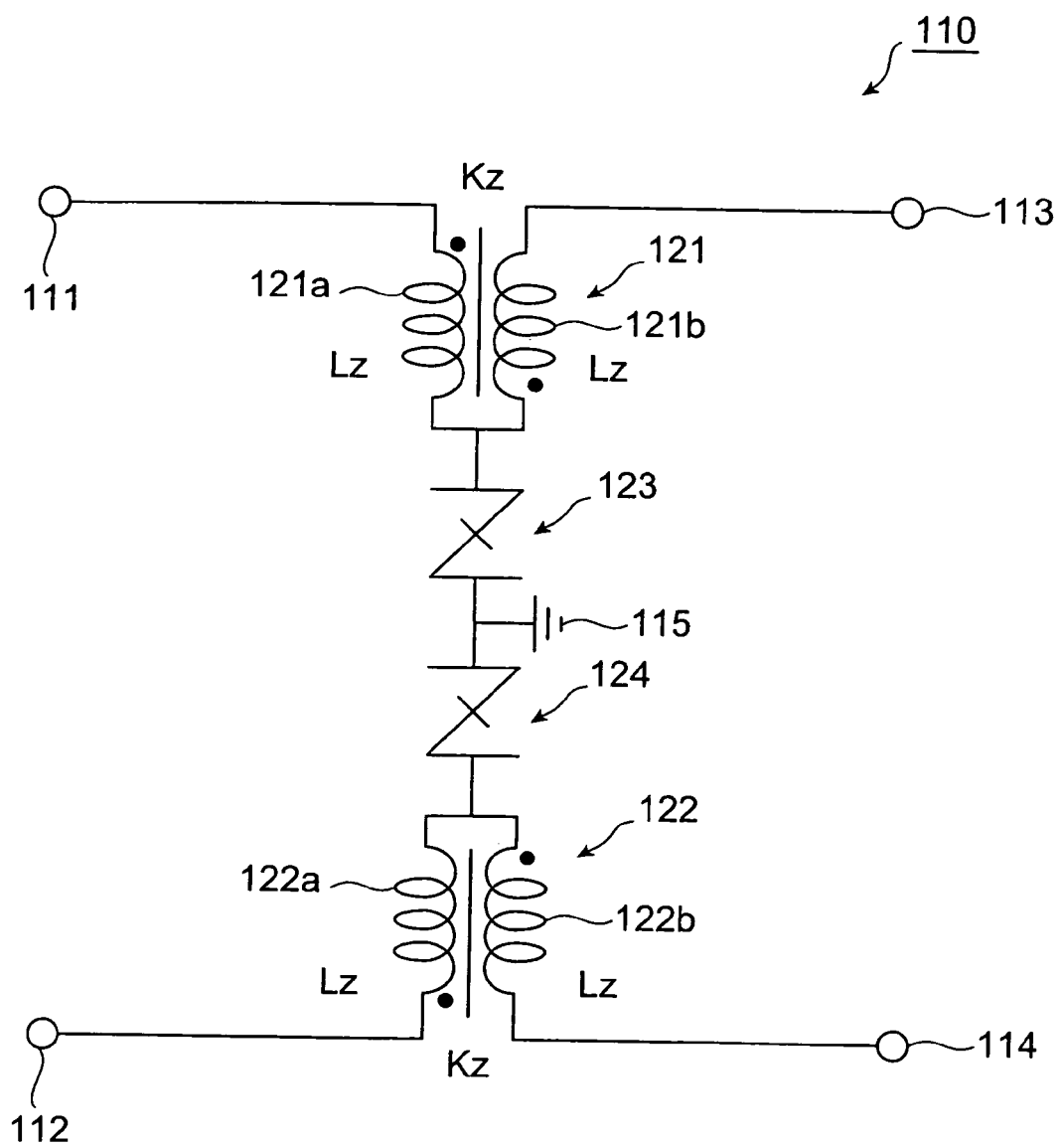
FIG. 20 is a diagram showing a circuit configuration of a surge absorption circuit according to a fourth embodiment of the present invention.

FIG. 20 is a diagram showing a circuit configuration of a surge absorption circuit according to a fourth embodiment of the present invention. A surge absorption circuit 110 shown in FIG. 20 comprises a pair of input terminals 111 and 112, a pair of output terminals 113 and 114, a common terminal 115, mutual inductive elements 121 and 122, and surge absorption elements 123 and 124.

In the surge absorption circuit 110, the pair of input terminals 111 and 112 and the pair of output terminals 113 and 114 are provided for connection with the external and they enable differential inputs and differential outputs. Further, the surge absorption circuit 110 comprises the common terminal 115.

The mutual inductive element 121 (the first mutual inductive element) has a first inductive element 121a as the primary side and a second inductive element 121b as the secondary side. In the mutual inductive element 121, one terminal of the primary side is connected to the input terminal 111, one terminal of the secondary side in which the inverted induction of a signal occurs is connected to the output terminal 113, and the other terminal of the primary side and the other terminal of the secondary side are connected to each other. A signal is induced from the input terminal 111 to the output terminal 113 so as to be inverted by the mutual inductive element 121. In other words, the first inductive element 121a and the second inductive element 121b are electromagnetically coupled to each other so as to increase each inductance. The coupling coefficient of the first inductive element 121a and the second inductive element 121b is 0.01 or more.

One terminal of the surge absorption element 123 (the first surge absorption element) is connected to the connection point of the other terminal of the primary side and the other terminal of the secondary side of the mutual inductive element 121. The other terminal of the surge absorption element 123 is connected to the common terminal 115.

The mutual inductive element 122 (the second mutual inductive element) has a third inductive element 122a as the primary side and a fourth inductive element 121b as the secondary side. In the mutual inductive element 122, one terminal of the primary side is connected to the input terminal 112, one terminal of the secondary side in which the inverted induction of a signal occurs is connected to the output terminal 114, and the other terminal of the primary side and the other terminal of the secondary side are connected to each other. A signal is induced from the input terminal 112 to the output terminal 114 so as to be inverted by the mutual inductive element 122. In other words, the third inductive element 122a and the fourth inductive element 122b are electromagnetically coupled to each other so as to increase each inductance. The coupling coefficient of the third inductive element 122a and the fourth inductive element 122b is 0.01 or more.

One terminal of the surge absorption element 124 (the second surge absorption element) is connected to the connection point of the other terminal of the primary side and the other terminal of the secondary side of the mutual inductive element 122. The other terminal of the surge absorption element 124 is connected to the common terminal 115.

To the surge absorption elements 123 and 124, a varistor utilizing a metal oxide such as ZnO, a PN junction element utilizing a semiconductor such as Si, a surge absorption element utilizing molybdenum, a gap type discharge element utilizing discharge between electrodes, and the like can be applied.

Here, the pair of input terminals 111 and 112 and the pair of output terminals 113 and 114 are distinguished from each other, however, the input side and the output side may be exchanged. Preferably, the common terminal 115 is grounded.

In the following explanation, it is assumed that the inductance of the first inductive element 121a and the second inductive element 121b of the mutual inductive element 121 and the inductance of the third inductive element 122a and the fourth inductive element 122b of the mutual inductive element 122 are Lz, respectively, and the coupling coefficient of the first inductive element 121a and the second inductive element 121b, and the coupling coefficient of the third inductive element 122a and the fourth inductive element 122b are Kz, respectively. The mutual inductive elements 121 and 122 can be realized by, for example, a common mode choke coil or a transformer.

Figure 21:
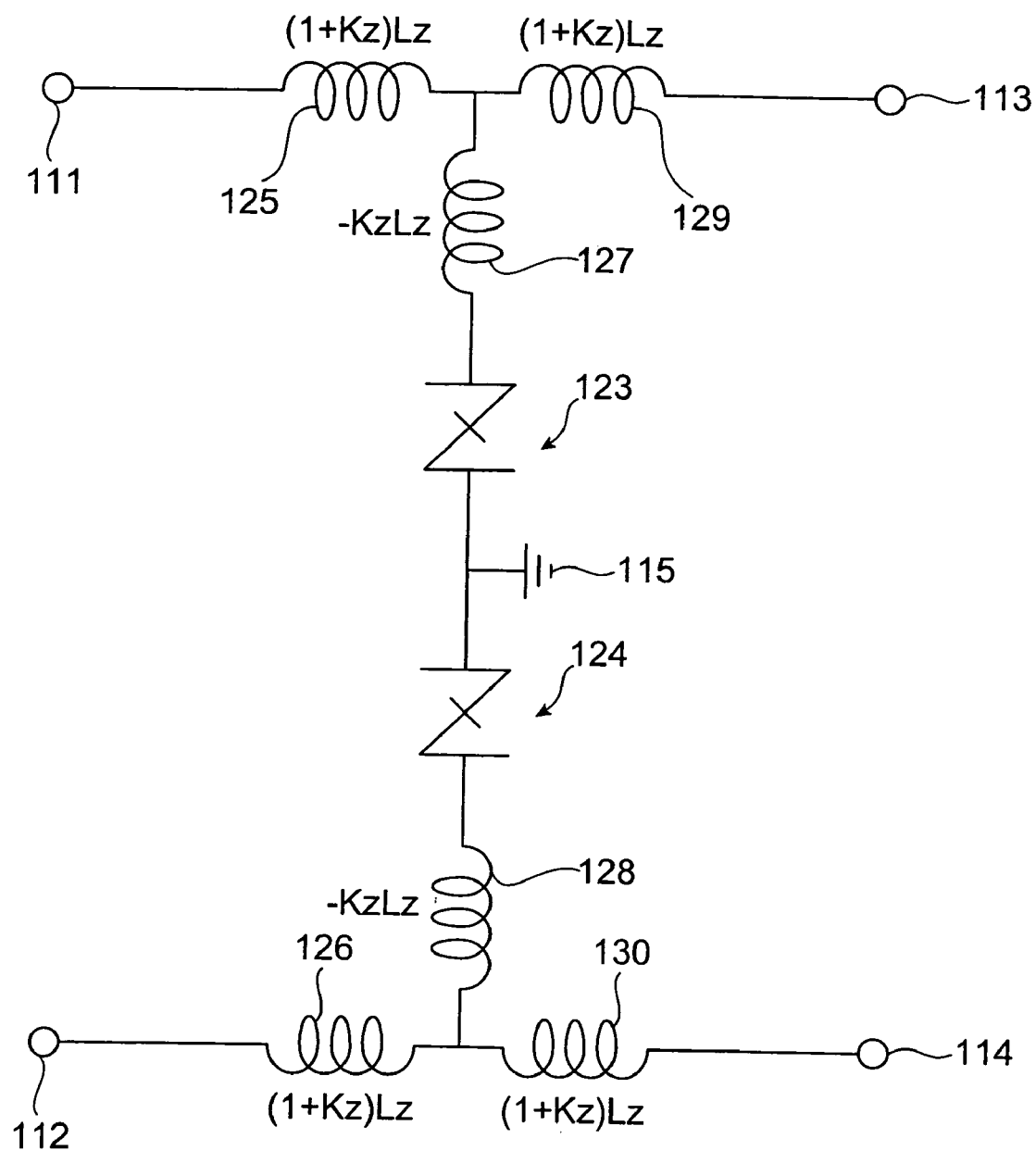
FIG. 21 is a diagram showing an equivalent circuit of the surge absorption circuit shown in FIG. 20.

FIG. 21 is a diagram showing an equivalent circuit of the surge absorption circuit shown in FIG. 20. The circuit configuration in FIG. 20 can be equivalently converted into the circuit configuration in FIG. 21. In FIG. 21, the same symbol as that in FIG. 20 represents the same meaning.

In the equivalent circuit shown in FIG. 21, inductive elements 125 and 129 are connected in series between the input terminal 111 and the output terminal 113. An inductive element 127 and the surge absorption element 123 are connected in series between the middle point of the inductive elements 125 and 129 connected in series and the common terminal 115. Inductive elements 126 and 130 are connected in series between the input terminal 112 and the output terminal 114. An inductive element 128 and the surge absorption element 124 are connected in series between the middle point of the inductive elements 126 and 130 connected in series and the common terminal 115. The coefficient of induction of each of the inductive elements 125, 126, 129, and 130 is (1+Kz) Lz and the coefficient of induction of each of the inductive elements 127 and 128 is $-K_z L_z$.

The input impedance of the surge absorption circuit 110 in FIG. 20 is expressed by the following equation (14). The surge absorption elements 123 and 124 are expressed by the equivalent circuit shown in FIG. 2, however, for a high speed signal with a small amplitude, they are approximated only by the stray capacitance 205 of the capacitance Cz. If the characteristic impedance of one line is assumed to be $Z_0$, the characteristic impedance $Zd_0$ of the differential signal line is expressed as $Zd_0 = 2 \cdot Z_0$.

$$Zin = 2 \times \sqrt{\frac{2(1 + Kz)Lz}{Cz} + \omega^2 Lz^2(Kz^2 - 1)} \tag{14}$$

When Kz=±1, the term including ω on the right hand side of the equation (14) disappears, therefore, the input impedance Zin becomes constant, without depending on the frequency. However, when Kz=−1, then Zin=0, which is not acceptable. Therefore, if Kz=1 and Lz is set so as to satisfy the following equation (15), it is possible to match the input impedance Zin to the characteristic impedance $Zd_0$.

$$Lz = \frac{Z_0^2 Cz}{4} \quad (15)$$

Therefore, the surge absorption circuit 110 in the present embodiment is capable of protecting a semiconductor device and the like from high voltage static electricity, and is excellent in impedance matching even for a high speed signal.

Figure 22:
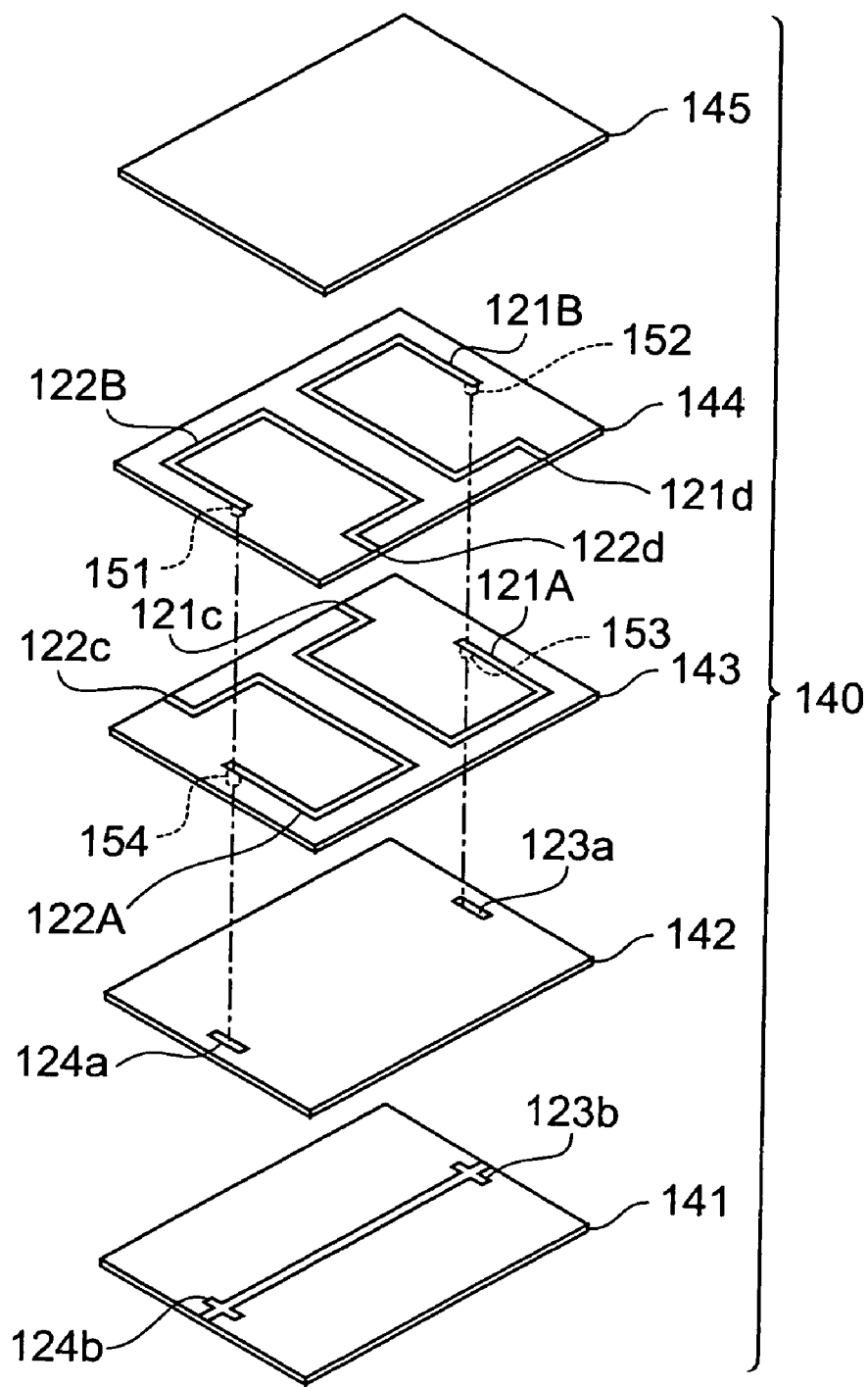
FIG. 22 is a perspective view showing each individual layer of an example of a laminated surge absorption device realized from the surge absorption circuit shown in FIG. 20 as a laminated type device.

Next, an example is explained, in which the surge absorption circuit 110 shown in FIG. 20 is realized as a laminated surge absorption device. FIG. 22 is a perspective view showing each individual layer of an example of a laminated surge absorption device realized from the surge absorption circuit shown in FIG. 20 as a laminated type device.

Figure 23:
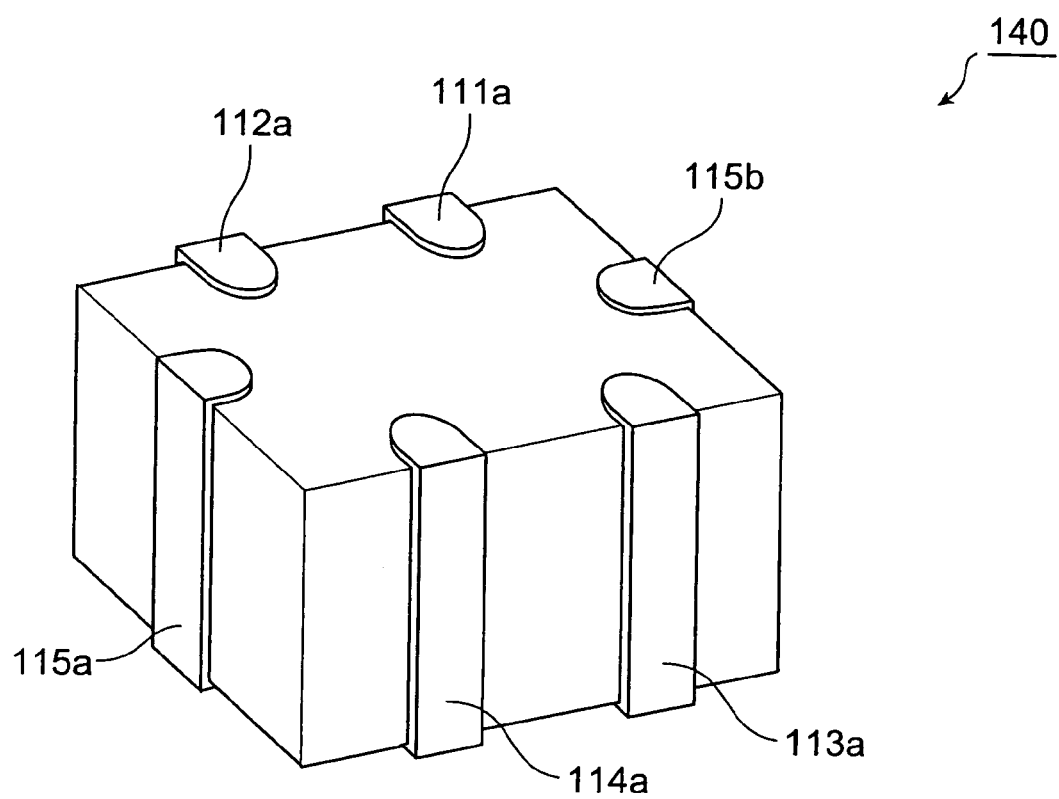
FIG. 23 is a perspective view of an example of a laminated surge absorption device realized from the surge absorption circuit shown in FIG. 20 as a laminated type device.

FIG. 23 is a perspective view showing an example of a laminated surge absorption device realized from the surge absorption circuit shown in FIG. 20 as a laminated type device.

As shown in FIG. 23, a laminated surge absorption device 140 has a substantially rectangular shape. The laminated surge absorption device 140 has a pair of input electrodes 111*a* and 112*a*, a pair of output electrodes 113*a* and 114*a*, and common electrodes 115*a* and 115*b* on its surface. The input electrode 111*a* can be used as the input terminal 111 and the input electrode 112*a*, as the input terminal 112. The output electrode 113*a* can be used as the output terminal 113 and the output electrode 114*a*, as the output terminal 114. Further, the common electrodes 115*a* and 115*b* can be used as the common terminal 115.

The laminated surge absorption device 140 includes on its surface a pair of planes extending in the lamination direction of a plurality of layers constituting the laminated surge absorption device and facing with each other. The input electrodes 111*a* and 112*a* are provided on one of the pair of planes and the output electrodes 113*a* and 114*a* are provided on the other plane of the pair of planes. The input electrode 111*a* and 112*a* and the output electrodes 113*a* and 114*a* extend in the lamination direction described above.

Further, the laminated surge absorption device 140 includes on its surface another pair of planes extending in the lamination direction described above and facing with each other. The common electrode 115*a* is provided on one of the other pair of planes and the common electrode 115*b* is provided on the other plane of the other pair of planes. The common electrode 115*a* and the common electrode 115*b* extend in the lamination direction described above.

In the above example, the input electrodes 111*a* and 112*a* and the output electrodes 113*a* and 114*a* are distinguished from each other, however, the input side and the output side may be exchanged. Preferably, the common electrode 115*a* or 115*b* is grounded.

Hereinafter, the structure and the material of each insulating layer constituting the laminated surge absorption device 140 are explained. As shown in FIG. 22, the laminated surge absorption device 140 has flat-plane-shaped insulating layers 141, 142, 143, 144, and 145 laminated in order in the lamination direction described above, mutual inductive element patterns 121A, 122A, 121B, and 122B, via holes 151, 152, 153, and 154, and surge absorption element patterns 123*a*, 124*a*, 123*b*, and 124*b*.

For the insulating layers 141, 142, 143, 144, and 145, a material with improved insulating properties to the circuit on its surface, for example, a dielectric material such as glass epoxy resin, fluorine contained resin, and ceramic can be used. Each element pattern formed on the surface of the insulating layer may be composed of a conductive material such as gold, platinum, silver, copper, lead, and alloy of these metals and the like, and can be manufactured by printing technology or etching technology.

The insulating layer 145 prevents the internal element pattern from coming into contact with the external. On the surface (one main surface) of the insulating layer 144, the mutual inductive element patterns 121B and 122B are formed. The mutual inductive element patterns 121B and 122B constitute the secondary side (the second inductive element 121*b*) of the mutual inductive element 121 and the secondary side (the fourth inductive element 122*b*) of the mutual inductive element 122, respectively.

The mutual inductive element patterns 121B and 122B are of coil-like shapes, respectively. One end 121*d* of the mutual inductive element pattern 121B is connected to the output electrode 113*a*. One end 122*d* of the mutual inductive element pattern 122B is connected to the output electrode 114*a*. The other end of the mutual inductive element pattern 121B is connected to the other end of the mutual inductive element pattern 121A constituting the primary side via the via hole 152 provided in the insulating layer 144. Further, the other end of the mutual inductive element pattern 122B is connected to the other end of the mutual inductive element pattern 122A constituting the primary side via the via hole 151 provided in the insulating layer 144.

On the surface (one main surface) of the insulating layer 143, the mutual inductive element patterns 121A and 122A are provided. The mutual inductive element patterns 121A and 122A constitute the primary side (the first inductive element 121*a*) of the mutual inductive element 121 and the primary side (the third inductive element 122*a*) of the mutual inductive element 122, respectively.

The mutual inductive element patterns 121A and 122A are of coil-like shapes, respectively. One end 121*c* of the mutual inductive element pattern 121A is connected to the input electrode 111*a* and one end 122*c* of the mutual inductive element pattern 122A is connected to the input electrode 112*a*.

A mutual inductive element is formed, which brings about inductive coupling between the mutual inductive element pattern 121A and the mutual inductive element pattern 121B and between the mutual inductive element pattern 122A and the mutual inductive element pattern 122B, respectively. In other words, the mutual inductive element pattern 121A and the mutual inductive element pattern 121B are arranged in a positional relationship that increases each inductance. Further, the mutual inductive element pattern 122A and the mutual inductive element pattern 122B are arranged in a positional relationship that increases each inductance.

In this example, the mutual inductive element pattern is formed in a single layer. However, it may be formed in plural layers. If formed in plural layers, a large coefficient of induction and a large coupling coefficient can be realized.

On the surface (one main surface) of the insulating layer 142, the surge absorption element pattern 123*a* and the surge absorption element pattern 124*a* are formed. The surge absorption element pattern 123*a* and the surge absorption element pattern 124*a* are connected to the other end of the mutual inductive element pattern 121A and the other end of the mutual inductive element pattern 122A via the via holes 153 and 154 provided in the insulating layer 143, respectively.

On the surface (one main surface) of the insulating layer 141, the surge absorption element patterns 123*b* and 124*b* are formed. The surge absorption element patterns 123*b* and 124b are connected to the common electrode 115a or 115b provided on the surface of the laminated surge absorption device 140.

The surge absorption element pattern 123a and the surge absorption element pattern 123b are facing with each other, placing the insulating layer 142 therebetween, thereby constituting the surge absorption element 123. The surge absorption element pattern 124a and the surge absorption element pattern 124b are facing with each other, placing the insulating layer 142 therebetween, thereby constituting the surge absorption element 124.

A via hole is provided in the insulating layer 142 and the via hole is filled with a material showing the varistor characteristics, for example, a semiconductor ceramic material having ZnO as its main component. Alternatively, a material showing the varistor characteristics, for example, a semiconductor ceramic material having ZnO as its main component may be used to form the insulating layer 142. In the example shown in FIG. 22, the surge absorption element pattern is formed in a single layer, however, it may be formed in plural layers.

A laminated body as shown in FIG. 23 is manufactured by integrated baking after the plural layers shown in FIG. 22 are laminated in order and adhered under pressure. On the surface of the laminated body, the pair of input electrodes 111a and 112a, the pair of output electrodes 113a and 114a, and the common electrodes 115a and 115b are formed. To an electrode material, a conductive material such as gold, platinum, silver, copper, lead, and alloy of these metals and the like can be applied.

In the laminated surge absorption device 140 completed in the manner described above, the mutual inductive element and the surge absorption element are formed in integrated manner. Therefore, the laminated surge absorption device 140 can be made compact and its stray capacitance can be reduced. Further, due to the circuit configuration of the surge absorption circuit 110 described above, the laminated surge absorption device 140 is capable of protecting a semiconductor device and the like from high voltage static electricity, and is excellent in impedance matching even for a high speed signal.

The surge test of the laminated surge absorption device 140 was conducted in the same way as in the first embodiment. The input electrode 111a on one side of the laminated surge absorption device 140 was connected to the output terminal 46 of the surge test apparatus shown in FIG. 11. At this time, the input electrode 112a on the other side of the laminated surge absorption device 140 was set to an open state and the common electrodes 115a and 115b of the laminated surge absorption device 140 and the output terminal 47 of the surge test apparatus were grounded. Further, the common electrodes 113a and 114a of the laminated surge absorption device 140 were terminated with a resistor of 50 Ω, respectively. From the direct current voltage source 41, a voltage of 2 kV was supplied and the capacitance of the capacitive element 43 was set to 150 pF and the resistance of the resistor 44 was set to 330 Ω.

First, in a state in which the switch 45 was left in an open state, the switch 42 was closed and the capacitive element 43 was charged from the direct current voltage source 41. Next, the switch 42 was left open and the switch 45 was closed, then the electric charges charged in the capacitive element 43 were input to the input electrode 111a of the laminated surge absorption device 140 via the resistor 44. At this time, the voltage applied to the output electrode 113a of the laminated surge absorption device 140 was measured.

Figure 24:
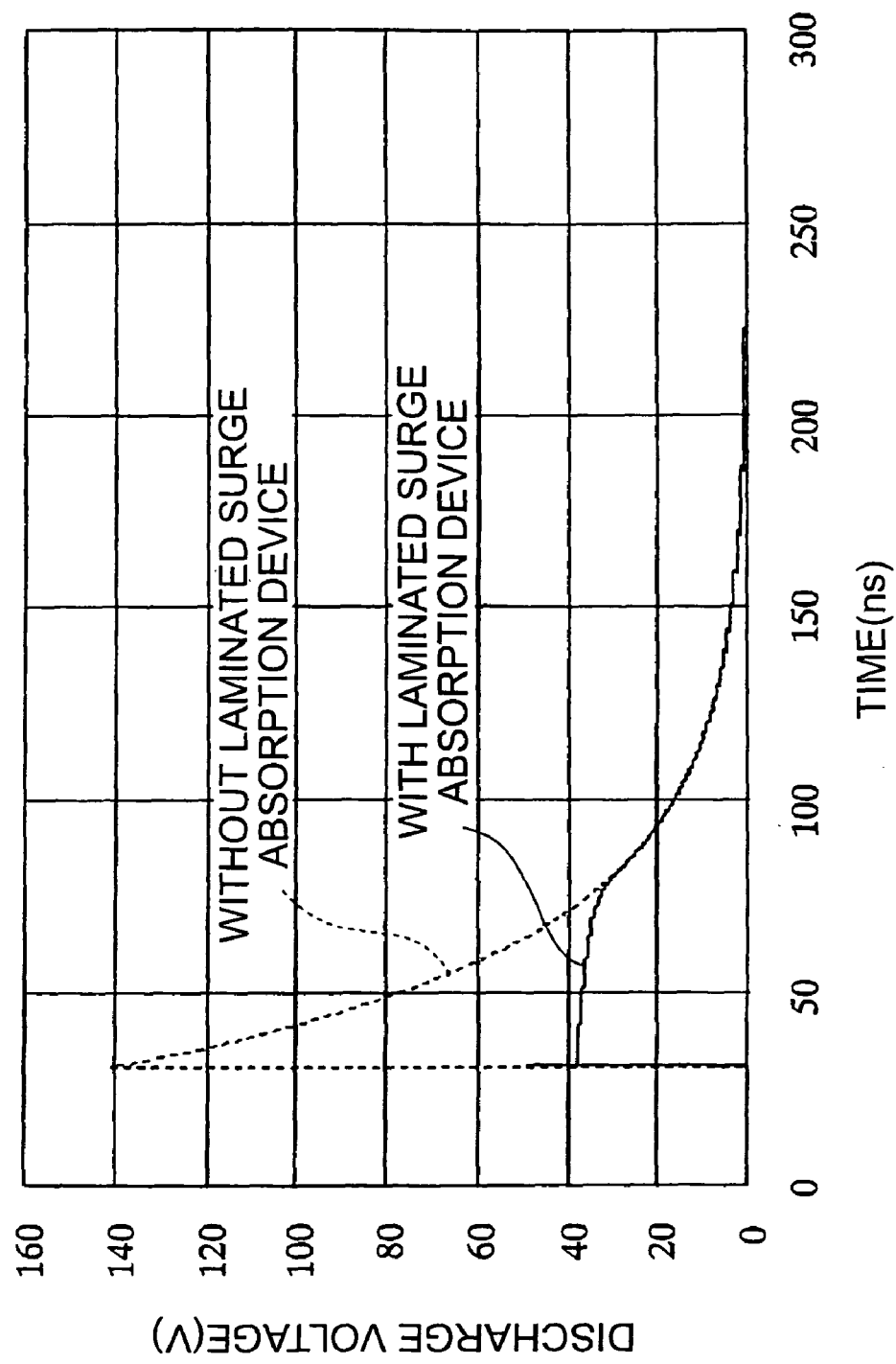
FIG. 24 is a diagram showing the result of the measurement of the voltage applied to a load circuit composed of the laminated surge absorption device shown in FIG. 22 and a load resistor.

The measurement result is shown in FIG. 24. In FIG. 24, the horizontal axis represents time (ns) and the vertical axis represents a discharge voltage (V), and the discharge voltage is compared with and without the laminated surge absorption device. From FIG. 24, it can be seen that a surge is sufficiently absorbed by adding the laminated surge absorption device 140 in the present embodiment.

Therefore, the laminated surge absorption device 140 having the configuration of the surge absorption circuit 110 in the present embodiment has high-performance surge absorption characteristics and is compact and excellent in impedance matching even for a high speed signal of differential inputs.

Fifth Embodiment

Figure 25:
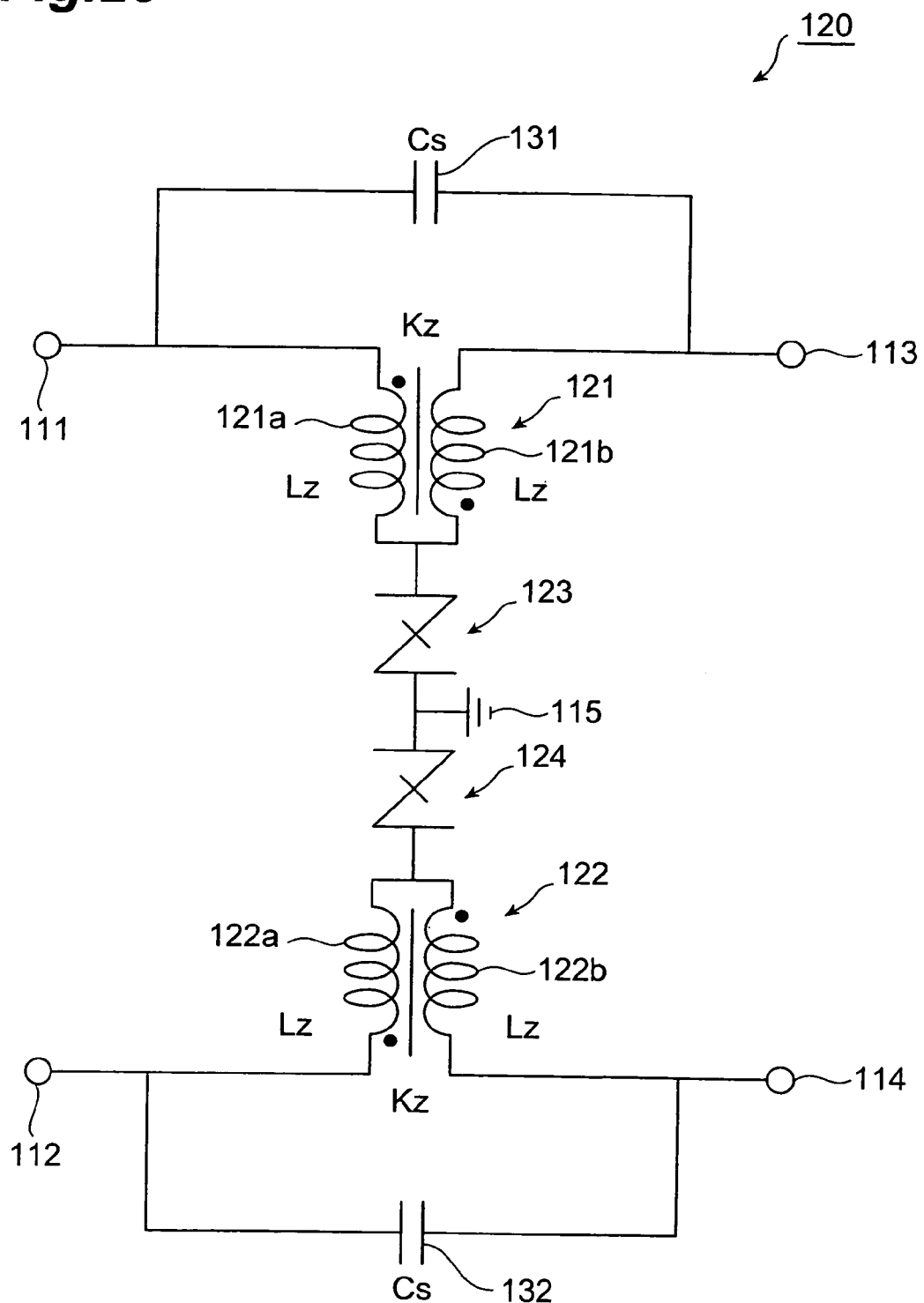
FIG. 25 is a diagram showing a circuit configuration of a surge absorption circuit according to a fifth embodiment of the present invention.

FIG. 25 is a diagram showing a circuit configuration of a surge absorption circuit according to a fifth embodiment of the present invention. As the surge absorption circuit 110, a surge absorption circuit 120 shown in FIG. 25 comprises the pair of input terminals 111 and 112, the pair of output terminals 113 and 114, the common terminal 115, the mutual inductive elements 121 and 122, and the surge absorption elements 123 and 124.

The surge absorption circuit 120 further comprises capacitive elements 131 and 132. The capacitive element 131 is connected between the input terminal 111 and the output terminal 113. The capacitive element 132 is connected between the input terminal 112 and the output terminal 114.

Here, the pair of input terminals 111 and 112 and the pair of output terminals 113 and 114 are distinguished from each other, however, the input side and the output side may be exchanged. Preferably, the common terminal 115 is grounded.

In the following explanation, it is assumed that the inductance of each of the first inductive element 121a and the second inductive element 121b of the mutual inductive element 121 and each of the third inductive element 122a and fourth inductive element 122b of the mutual inductive element 122 is Lz, and the coupling coefficient of the first inductive element 121a and the second inductive element 121b, and the coupling coefficient of the third inductive element 122a and the fourth inductive element 122b are Kz, respectively. Further, the capacitance of the capacitive elements 131 and 132 is assumed to be Cs. The mutual inductive elements 121 and 122 can be realized by, for example, a common mode choke coil or a transformer.

Figure 26:
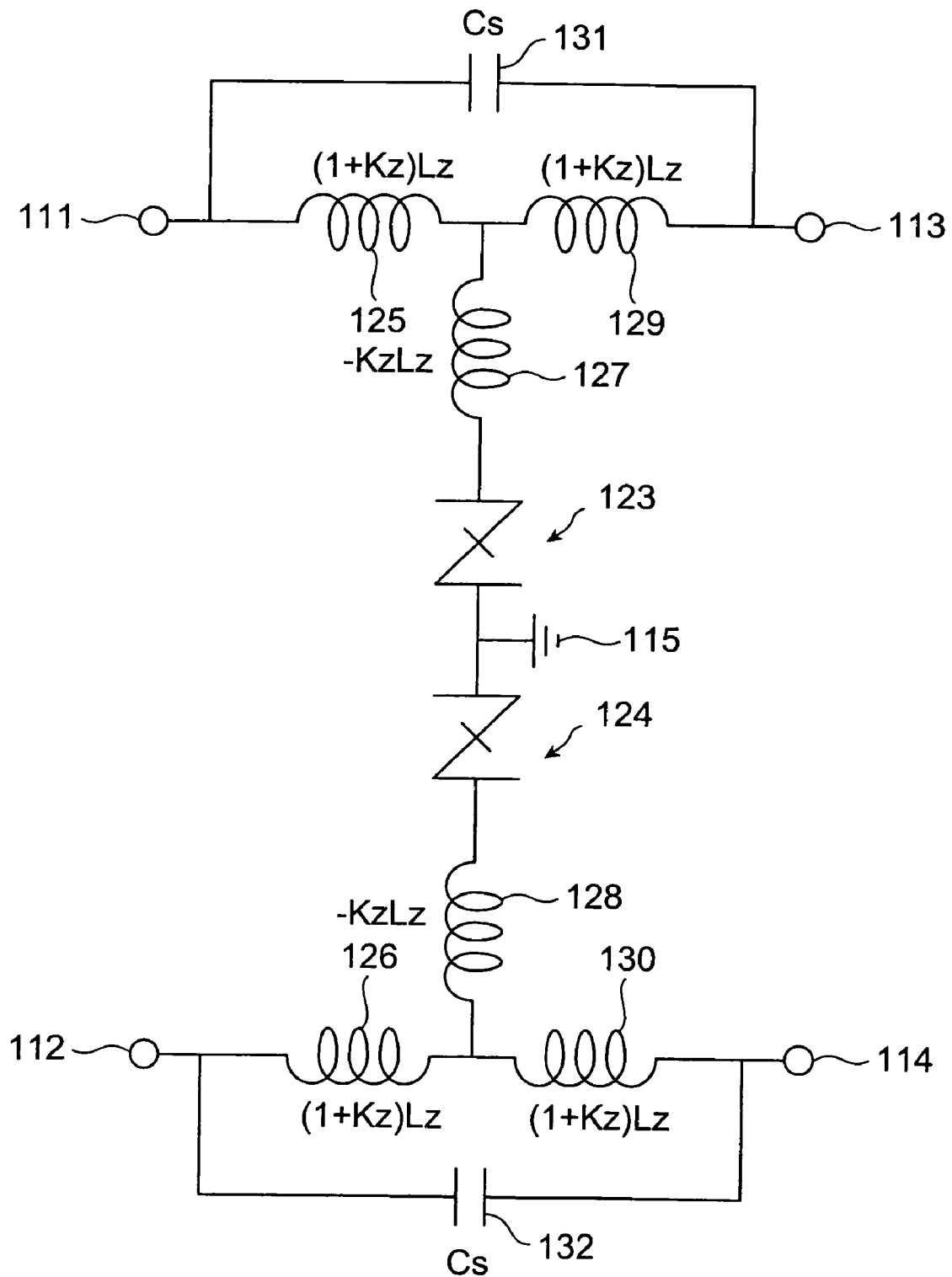
FIG. 26 is a diagram showing an equivalent circuit of the surge absorption circuit shown in FIG. 25.

FIG. 26 is a diagram showing an equivalent circuit of the surge absorption circuit shown in FIG. 25. The surge absorption circuit 120 can be equivalently converted into the circuit configuration shown in FIG. 26. In FIG. 26, the same symbol as that in FIG. 25 represents the same meaning.

In the equivalent circuit shown in FIG. 26, the inductive elements 125 and 129 are connected in series between the input terminal 111 and the output terminal 113. The inductive element 127 and the surge absorption element 123 are connected in series between the middle point of the inductive elements 125 and 129 connected in series and the common terminal 115. The inductive elements 126 and 130 are connected in series between the input terminal 112 and the output terminal 114. The inductive element 128 and the surge absorption element 124 are connected in series between the middle point of the inductive elements 126 and 130 connected in series and the common terminal 115. The capacitive element 131 is connected between the input terminal 111 and the output terminal 113 and the capacitive element 132 is connected between the input terminal 112 and the output terminal 114. The coefficient of induction of each of the inductive elements 125, 126, 129, and 130 is $(1+Kz)Lz$, the coefficient of induction of each of the inductive elements 127 and 128 is −KzLz, and the capacitance of each of the capacitive elements 131 and 132 is Cs.

The input impedance Zin of the surge absorption circuit 120 in FIG. 26 is expressed by the following equation (16). Each of the surge absorption elements 123 and 124 is expressed by the equivalent circuit shown in FIG. 2, however, for a high speed signal with a small amplitude, it is approximated only by the stray capacitance 205 of the capacitance Cz.

$$Zin = 2 \times \sqrt{\frac{2(1+Kz)Lz}{Cz} \frac{1-\omega^2 Lz((1-Kz)Cz/2)}{1-\omega^2 Lz(2(1+Kz)Cs)}} \quad (16)$$

If Cs is set so as to satisfy the following equation (17), the input impedance Zin no longer depends on frequency. Then, if Cs is set as shown in the equation (17) and Lz is set as shown in the following equation (18), the input impedance Zin can be matched to the characteristic impedance $Zd_0$.

$$Cs = \frac{1-Kz}{4(1+Kz)} Cz \quad (17)$$

$$Lz = \frac{Z_0^2 Cz}{2(1+Kz)} \quad (18)$$

As understood from the above-mentioned equations (17) and (18), it is possible to design the surge absorption circuit 120 more flexibly than the surge absorption circuit 110 according to the fourth embodiment because the coupling coefficient Kz can be selected arbitrarily.

Therefore, the surge absorption circuit 120 in the present embodiment is capable of protecting a semiconductor device and the like from high voltage static electricity of differential inputs and is excellent in impedance matching even for a high speed signal of differential inputs.

As described in the second embodiment, the surge absorption element actually includes a stray inductive component. Because of this, if the surge absorption circuit is added to the input side of a semiconductor device that deals with a high speed signal as an input signal, the high speed signal is caused to degrade. As described above, in order to apply the surge absorption circuit to a circuit that deals with a high speed signal, it is preferable to reduce the influence of not only the stray capacitive component but also the stray inductive component.

As known from the equivalent circuit shown in FIG. 26, by utilizing the inductive elements 127 and 128 with a negative coefficient of induction, it is possible to cancel the stray inductive component included in the surge absorption element. On the other hand, a state in which coupling becomes weak apparently is brought about, and Cs is therefore set as shown in the following (19) while leaving Kz and Lz unchanged. Here, KzLz≧Le.

$$Cs = \frac{1-Kz+2Le/Lz}{4(1+Kz)} Cz \quad (19)$$

If designed as described above, it is possible to mach the input impedance Zin to the characteristic impedance $Zd_0$ even if the stray capacitive component and the stray inductive component are included in the surge absorption element.

Therefore, the surge absorption circuit 120 in the present embodiment is capable of protecting a semiconductor device and the like from high voltage static electricity and is excellent in impedance matching even for a high speed signal of differential inputs.

Figure 27:
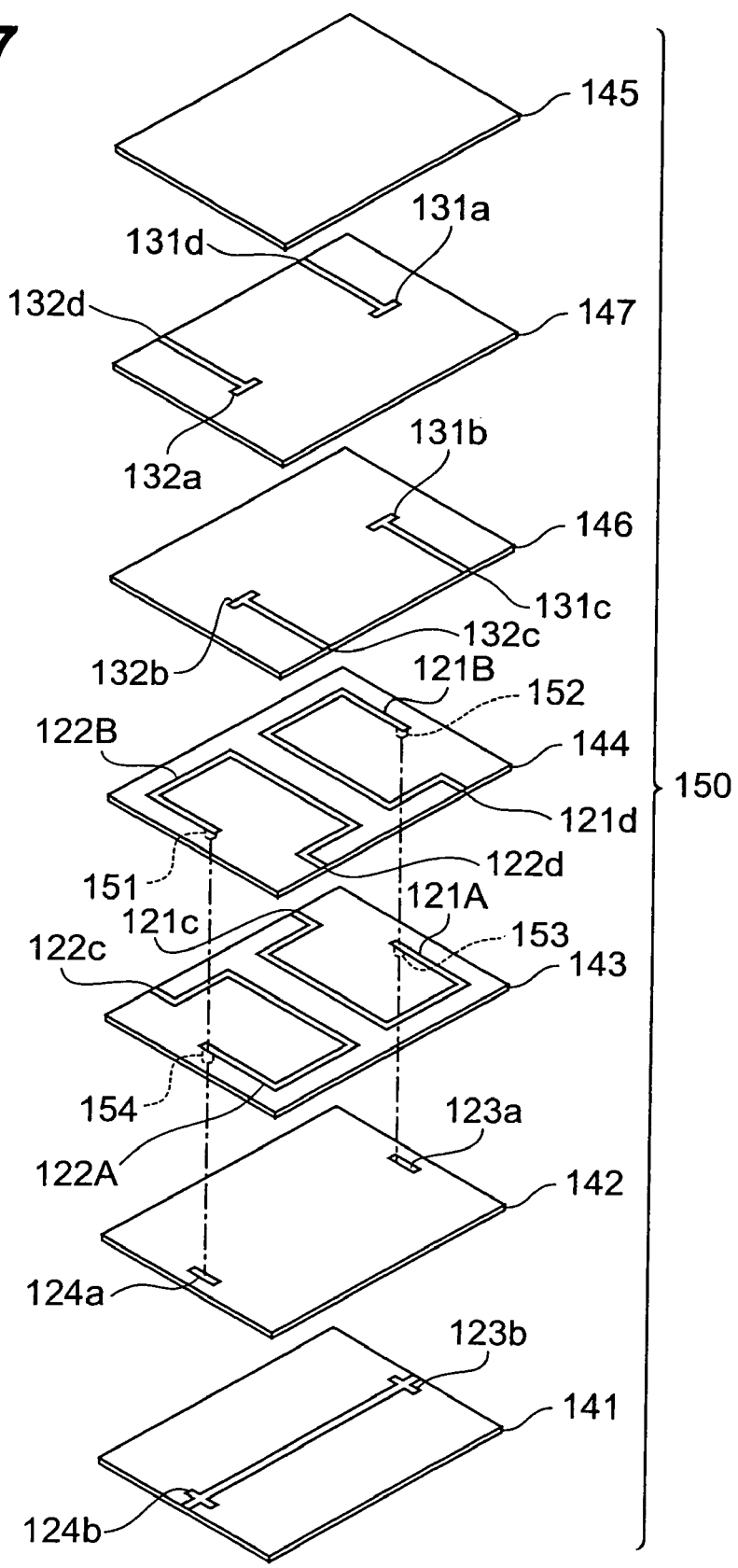
FIG. 27 is an exploded perspective view showing each individual layer of an example of a laminated surge absorption device realized from the surge absorption circuit shown in FIG. 25 as a laminated type device.

Next, an example is explained, in which the surge absorption circuit 120 is realized as a laminated surge absorption device. FIG. 27 is an exploded perspective view showing each individual layer of an example of a laminated surge absorption device realized from a surge absorption circuit as a laminated type device.

A laminated surge absorption device 150 shown in FIG. 27 further has flat-plane-shaped insulating layers 146 and 147, and capacitive element patterns 131a, 132a, 131b, and 132b, in addition to the same components as those of the laminated surge absorption device 140.

The insulating layers 146 and 147 are provided between the insulating layer 144 and the insulating layer 145. The capacitive element patterns 131a and 132a are provided on one main surface of the insulating layer 147. The capacitive element patterns 131b and 132b are provided on one main surface of the insulating layer 146. A part of the capacitive element pattern 131a and a part of the capacitive element pattern 131b are facing with each other, placing the insulating layer 147 therebetween, thereby constituting the capacitive element 131. A part of the capacitive element pattern 132a and a part of the capacitive element pattern 132b are facing with each other, placing the insulating layer 147 therebetween, thereby constituting the capacitive element 132.

The laminated surge absorption device 150 has the same external shape as that of the laminated surge absorption device 140 and has the same electrodes as those of the laminated surge absorption device 140 on its surfaces. One end 131d of the capacitive element pattern 131a is connected to the input electrode 111a. One end 131c of the capacitive element pattern 131b is connected to the output electrode 113a. One end 132d of the capacitive element pattern 132a is connected to the input electrode 112a. One end 132c of the capacitive element pattern 132b is connected to the output electrode 114a.

The structure and the material of each insulating layer constituting the laminated surge absorption device 150 are the same as those of the laminated surge absorption device 140. In the laminated surge absorption device 150, the mutual inductive element patterns 121A and 122A and the capacitive element patterns 131a and 132a are formed on different insulating layers, and the mutual inductive element patterns 121B and 122B and the capacitive element patterns 131b and 132b are formed on different insulating layers. However, they may be formed on the same insulating layers, respectively. Further, the line widths of the mutual inductive element patterns 121A and 122A and the mutual inductive element patterns 121B and 122B may be increased and used as a capacitive element pattern.

Here, the input electrodes 111a and 112a and the output electrodes 113a and 114a are distinguished from each other, however, the input side and the output side may be exchanged. Preferably, the common electrode 115a or 115b is grounded.

In the laminated surge absorption device 150 completed in the manner described above, the mutual inductive element and the surge absorption element are formed in integrated manner. Therefore, the laminated surge absorption device 150 can be made compact and its stray capacitance can be reduced. Further, due to the circuit configuration of the surge absorption circuit 120 described above, the laminated surge absorption device 150 is capable of protecting a semiconductor device and the like from high voltage static electricity and is excellent in impedance matching even for a high speed signal of differential inputs. The surge test result of the laminated surge absorption device 150 was as excellent as the laminated surge absorption device 140 in the fourth embodiment.

Sixth Embodiment

Figure 28:
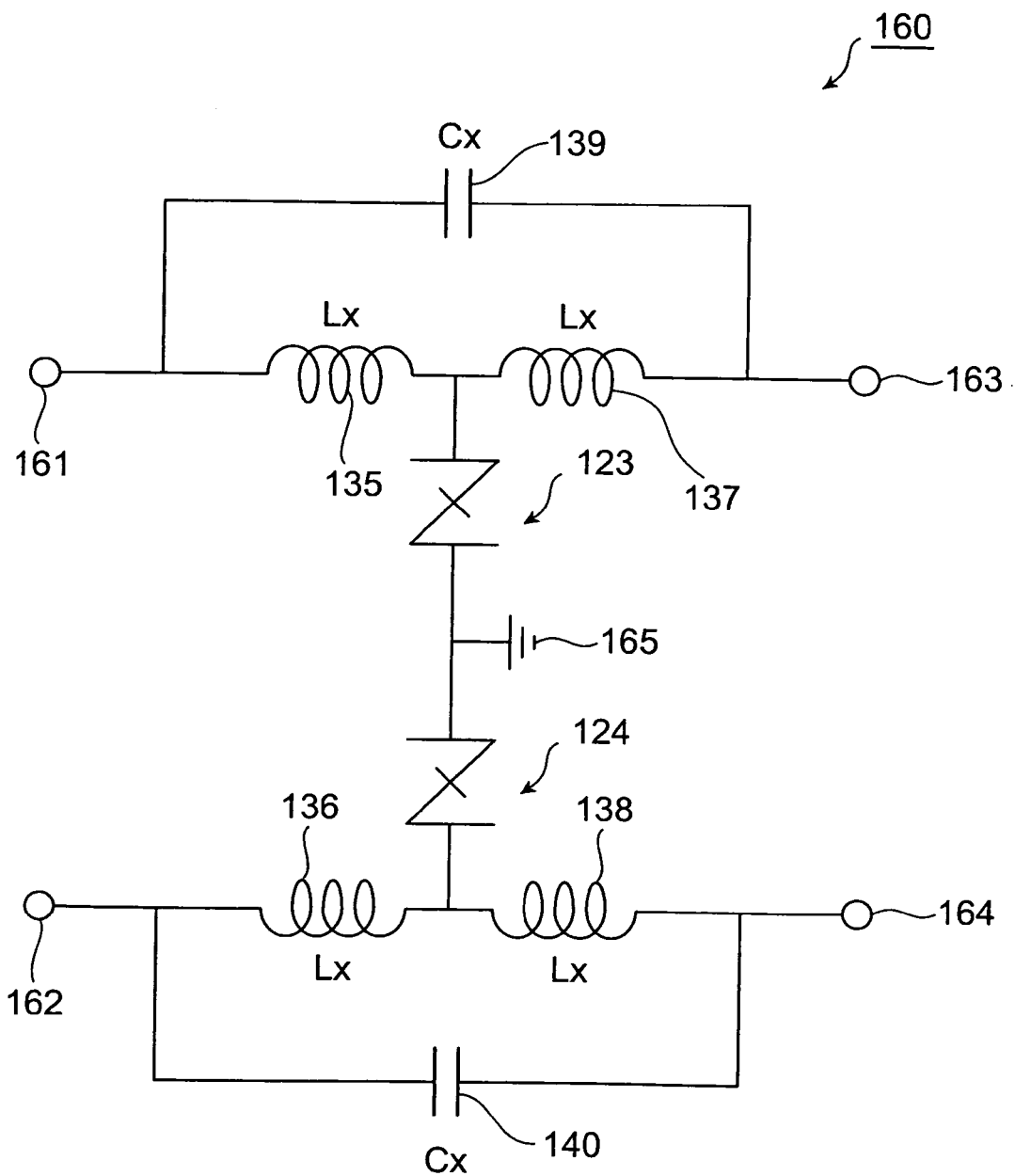
FIG. 28 is a diagram showing a circuit configuration of a surge absorption circuit according to a sixth embodiment of the present invention.

FIG. 28 is a diagram showing a circuit configuration of a surge absorption circuit according to a sixth embodiment of the present invention. A surge absorption circuit 160 shown in FIG. 28 comprises a pair of input terminals 161 and 162, a pair of output terminals 163 and 164, a common terminal 165, inductive elements 135, 136, 137, and 138, the surge absorption elements 123 and 124, and capacitive elements 139 and 140.

In the surge absorption circuit 160, the pair of input terminals 161 and 162 and the pair of output terminals 163 and 164 are provided for connection with the external, and the common terminal 165 is provided for connection within the internal.

The inductive element 135 (the first inductive element) and the inductive element 137 (the second inductive element) are connected in series between the input terminal 161 and the output terminal 163. The inductive element 136 (the third inductive element) and the inductive element 138 (the fourth inductive element) are connected in series between the input terminal 162 and output terminal 164. The inductive elements 135, 136, 137, and 138 may not be coupled electromagnetically and the coupling coefficient may be less than 0.01, respectively.

The capacitive element 139 (the first capacitive element) is connected between the input terminal 161 and the output terminal 163 and provided in parallel to the inductive elements 135 and 137. The capacitive element 140 (the second capacitive element) is connected between the input terminal 162 and the output terminal 164 and provided in parallel to the inductive elements 136 and 138.

One terminal of the surge absorption element 123 (the first surge absorption element) is connected to the connection point of the inductive element 135 and the inductive element 137 and the other terminal of the surge absorption element 123 is connected to the common terminal 165. One terminal of the surge absorption element 124 (the second surge absorption element) is connected to the connection point of the inductive element 136 and the inductive element 138 and the other terminal of the surge absorption element 124 is connected to the common terminal 165.

To the surge absorption elements 123 and 124, a varistor utilizing a metal oxide such as ZnO, a PN junction element utilizing a semiconductor such as Si, a surge absorption element utilizing molybdenum, a gap type discharge element utilizing discharge between electrodes and the like can be applied.

Here, the pair of input terminals 161 and 162 and the pair of output terminals 163 and 164 are distinguished from each other, however, the input side and the output side may be exchanged. Preferably, the common terminal 165 is grounded.

In the following explanation, it is assumed that the inductance of each of the inductive elements 135, 136, 137, and 138 is Lx and the capacitance of each of the capacitive elements 139 and 140 is Cx.

The input impedance of the surge absorption circuit 160 is expressed by the following equation (20). Here, the surge absorption elements 123 and 124 are expressed by the equivalent circuit shown in FIG. 2, however, they are approximated only by the stray capacitance 205 of the capacitance Cz in FIG. 2 for a high speed signal with a small amplitude.

$$Zin = 2 \times \sqrt{\frac{2Lx}{Cz} \frac{1 - \omega^2 Lx(Cz/2)}{1 - \omega^2 Lx(2Cx)}} \quad (20)$$

If Cx is set so as to satisfy the following equation (21), the input impedance Zin shown in the equation (20) no longer depends on frequency. If Cx is set as shown in the following equation (21) and Lz is set as shown in the following equation (22), the input impedance Zin can be matched to the characteristic impedance $Zd_0$.

$$Cx = \frac{Cz}{4} \quad (21)$$

$$Lx = \frac{Z_0^2 Cz}{2} \quad (22)$$

Therefore, the surge absorption circuit 160 in the present embodiment is capable of protecting a semiconductor device and the like from high voltage static electricity and is excellent in impedance matching even for a high speed signal of differential inputs.

Figure 29:
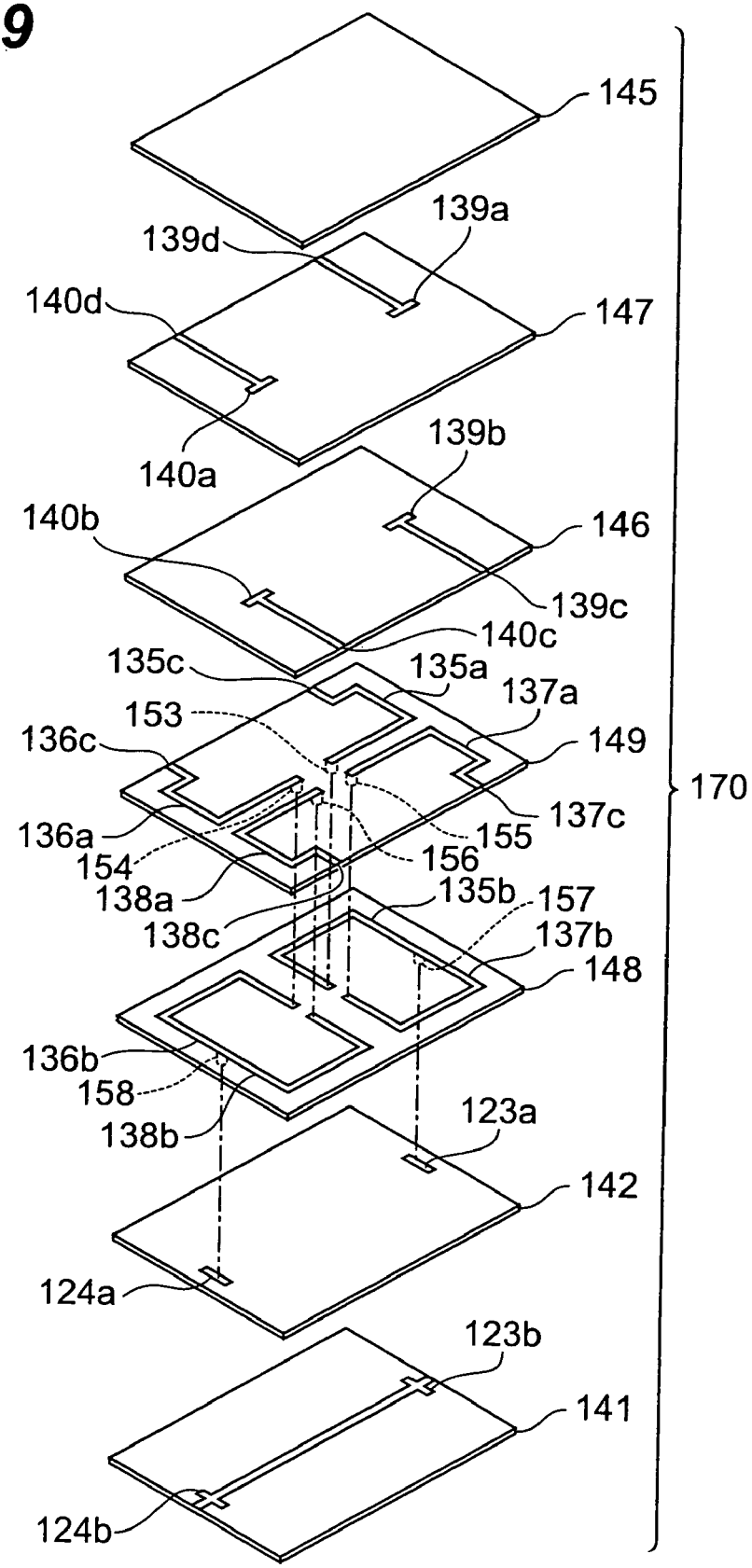
FIG. 29 is an exploded perspective view showing each individual layer of an example of a laminated surge absorption device realized from the surge absorption circuit shown in FIG. 28 as a laminated type device.

Next, an example is explained, in which the surge absorption circuit 160 is realized as a laminated surge absorption device. FIG. 29 is an exploded perspective view showing each individual layer of an example of a laminated surge absorption device realized from the surge absorption circuit shown in FIG. 28 as a laminated type device.

A laminated surge absorption device 170 shown in FIG. 29 comprises flat-plane-shaped insulating layers 141, 142, 145, 146, 147, 148, and 149, inductive element patterns 135a, 135b, 136a, 136b, 137a, 137b, 138a, and 138b, via holes 153, 154, 155, 156, 157, and 158, the surge absorption element patterns 123a, 123b, 124a, and 124b, and capacitive element patterns 139a, 140a, 139b, and 140b.

The structure and the material of each insulating layer constituting the laminated surge absorption device 170 are the same as those of the laminated surge absorption device 150. Further, the laminated surge absorption device 170 has the same external shape as that of the laminated surge absorption device 140 and has the same electrodes as those of the laminated surge absorption device 170 on its surfaces.

The insulating layer 145 prevents the internal element pattern from coming into contact with the external. On one main surface of the insulating layer 147, the capacitive element patterns 139a and 140a are formed. Further on one main surface of the insulating layer 146, the capacitive element patterns 139b and 140b are formed.

A part of the capacitive element pattern 139a and a part of the capacitive element pattern 139b are facing with each other, placing the insulating layer 147 therebetween, thereby constituting the capacitive element 139. A part of the capacitive element pattern 140a and a part of the capacitive element pattern 140b are facing with each other, placing the insulating layer 147 therebetween, thereby constituting the capacitive element 140.

One end 139d of the capacitive element pattern 139a is connected to the input electrode 111a and one end of the capacitive element pattern 140a is connected to the input electrode 112a. Further, one end 139c of the capacitive element pattern 139b is connected to the output electrode 113a and one end of the capacitive element pattern 140*b* is connected to the output electrode 114*a*.

On the insulating layer 149, the inductive element patterns 135*a*, 136*b*, 137*a*, and 138*a* are formed. One end 135*c* of the inductive element pattern 135*a* is connected to the input electrode 111*a*, one end 135*c* of the inductive element pattern 136*a* is connected to the input electrode 112*a*, one end 137*c* of the inductive element pattern 137*a* is connected to the output electrode 113*a*, and one end 138*c* of the inductive element pattern 138*a* is connected to the output electrode 114*a*.

The insulating layer 148 is provided with the inductive element patterns 135*b*, 136*b*, 137*b*, and 138*b*. To one end of the inductive element pattern 135*b*, the other end of the inductive element pattern 135*a* is connected via the via hole 153, to one end of the inductive element pattern 136*b*, the other end of the inductive element pattern 136*a* is connected via the via hole 154, to one end of the inductive element pattern 137*b*, the other end of the inductive element pattern 137*a* is connected via the via hole 155, and to one end of the inductive element pattern 138*b*, the other end of the inductive element pattern 138*a* is connected via the via hole 156, respectively.

The inductive element patterns 135*a* and 135*b* constitute the inductive element 135. The inductive element patterns 136*a* and 136*b* constitute the inductive element 136. The inductive element patterns 137*a* and 137*b* constitute the inductive element 137. The inductive element patterns 138*a* and 138*b* constitute the inductive element 138. The inductive element patterns 135*a*, 135*b*, 136*a*, 136*b*, 137*a*, 137*b*, 138*a*, and 138*b* and the inductive elements 135, 136, 137, and 138 are arranged such that they are not coupled electromagnetically, in other words, the coupling coefficient is less than 0.01.

The other end of the inductive element pattern 135*b* and the other end of the inductive element pattern 137*b* are connected to the surge absorption element pattern 123*a* provided on one main surface of the insulating layer 142 via the via hole 147. Further, the other end of the inductive element pattern 136*b* and the other end of the inductive element pattern 138*b* are connected to the surge absorption element pattern 124*a* provided on one main surface of the insulating layer 142 via the via hole 147.

On one main surface of the insulating layer 141, the surge absorption element pattern 123*b* and the surge absorption element pattern 124*b* are formed. The surge absorption element pattern 123*b* and the surge absorption element pattern 124*b* are connected to the common electrodes 115*a* and 115*b*. The surge absorption element patterns 123*a* and 123*b* are facing with each other, placing the insulating layer 142 therebetween, thereby constituting the surge absorption element 123. Further, the surge absorption element patterns 124*a* and 124*b* are facing with each other, placing the insulating layer 142 therebetween, thereby constituting the surge absorption element 124.

In the laminated surge absorption device 170 shown in FIG. 29, the inductive element patterns 135*a*, 136*a*, 137*a*, and 138*a* and the inductive element patterns 135*b*, 136*b*, 137*b*, and 138*b* are formed on the different insulating layers, however, they may be formed on the same layer. Further, the inductive element patterns 135*a*, 136*a*, 137*a*, and 138*a*, the capacitive element patterns 139*a* and 140*a*, and the capacitive element patterns 139*b* and 140*b* are formed on the different insulating layers, respectively, however, they may be formed on the same layer.

Here, the input electrodes 111*a* and 112*a* and the output electrodes 113*a* and 114*a* are distinguished from each other, however, the input side and the output side may be exchanged. Preferably, the common electrode 115*a* or 115*b* is grounded.

In the laminated surge absorption device 170 described above, the mutual inductive element and the surge absorption element are formed in integrated manner. Therefore, the laminated surge absorption device 170 can be made compact and its stray capacitance can be reduced. Further, due to the circuit configuration of the surge absorption circuit 160 described above, the laminated surge absorption device 170 is capable of protecting a semiconductor device and the like from high voltage static electricity and is excellent in impedance matching even for a high speed signal of differential inputs. By the way, the surge test result of the laminated surge absorption device 170 was as excellent as the laminated surge absorption device 140 in the fourth embodiment.

As described above about the preferred embodiments of the present invention, according to the present invention, a surge absorption circuit that protects a semiconductor device and the like from high voltage static electricity and is excellent in impedance matching over a wide frequency band is provided. The surge absorption circuit and the laminated surge absorption device according to the present invention can be applied to a high frequency circuit substrate mounting a semiconductor.

What is claimed is:

1. A surge absorption circuit comprising:
   an input terminal;
   an output terminal
   a common terminal;
   a mutual inductive element having a first inductive element and a second inductive element which are electromagnetically coupled to each other so as to increase each inductance, one terminal of the first inductive element being connected to the input terminal, one terminal of the second inductive element being connected to the output terminal, and the other terminal of the first inductive element and the other terminal of the second inductive element being connected to each other; and
   a surge absorption element having one terminal connected to the other terminal of the first inductive element and the other terminal of the second inductive element and the other terminal connected to the common terminal.

2. The surge absorption circuit according to claim 1, further comprising a capacitive element provided in parallel to the mutual inductive element and connected to the input terminal and the output terminal.

3. A surge absorption circuit comprising:
   an input terminal;
   an output terminal;
   a common terminal;
   two inductive elements connected in series and provided between the input terminal and the output terminal;
   a capacitive element connected to the input terminal and the output terminal and provided in parallel to the two inductive elements; and
   a surge absorption element connected to the connection point of the two inductive elements and the common terminal.

4. A surge absorption circuit comprising:
   a common terminal;
   a pair of input terminals:
   a pair of output terminals;
   a first mutual inductive element having a first inductive element and a second inductive element which are electromagnetically coupled to each other so as to increase each inductance, one terminal of the first inductive element being connected to one of the pair of input terminals, one terminal of the second inductive element being connected to one of the pair of output terminals, and the other terminal of the first inductive element and the other terminal of the second inductive element being connected to each other;

a first surge absorption element having one terminal connected to the other terminal of the first inductive element and the other terminal of the second inductive element and the other terminal connected to the common terminal;

a second mutual inductive element having a third inductive element and a fourth inductive element which are electromagnetically coupled to each other so as to increase each inductance, one terminal of the third inductive element being connected to the other of the pair of input terminals, one terminal of the fourth inductive element being connected to the other of the pair of output terminals, and the other terminal of the third inductive element and the other terminal of the fourth inductive element being connected to each other; and a second surge absorption element having one terminal connected to the other terminal of the third inductive element and the other terminal of the fourth inductive element and the other terminal connected to the common terminal.

5. The surge absorption circuit of claim 1, wherein a coupling coefficient of the mutual inductive element is set so that an input impedance of the surge absorption circuit is not dependent on a frequency with respect to an input signal input to the input terminal.

6. The surge absorption circuit of claim 5, wherein the coupling coefficient is 1.

7. The surge absorption circuit of claim 2, wherein a coupling coefficient of the mutual inductive element and a capacitance of the capacitive element are set so that an input impedance of the surge absorption circuit is not dependent on a frequency with respect to an input signal input to the input terminal.

8. The surge absorption circuit of claim 7, wherein the coupling coefficient Kz of the mutual inductive element, the capacitance Cs of the capacitive element and a stray capacitance Cz of the surge absorption element have the following relationship.

$$Cs = \frac{1 - Kz}{4(1 + Kz)} Cz.$$

9. The surge absorption circuit of claim 3, wherein a capacitance of the capacitive element is set so that an input impedance of the surge absorption circuit is not dependent on a frequency with respect to an input signal input to the input terminal.

10. The surge absorption circuit of claim 9, wherein the capacitance Cx of the capacitive element and a stray capacitance Cz of the surge absorption element have the following relationship.

$$Cx = \frac{Cz}{4}.$$

11. The surge absorption circuit of claim 4, wherein a coupling coefficient of the first mutual inductive element and a coupling coefficient of the second mutual inductive element are set so that an input impedance of the surge absorption circuit is not dependent on a frequency with respect to input signals input to the pair of input terminals.

12. The surge absorption circuit of claim 11, wherein the coupling coefficient of the first mutual inductive element and the coupling coefficient of the second mutual inductive element are 1.

* * * * *